US010021815B2

(12) United States Patent
Yamanaka et al.

(10) Patent No.: US 10,021,815 B2
(45) Date of Patent: Jul. 10, 2018

(54) POWER CONVERSION APPARATUS

(71) Applicant: KABUSHIKI KAISHA YASKAWA DENKI, Kitakyushu-shi (JP)

(72) Inventors: Yasunori Yamanaka, Kitakyushu (JP); Takatoshi Koura, Kitakyushu (JP); Junichi Yokoyama, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 15/345,511

(22) Filed: Nov. 8, 2016

(65) Prior Publication Data

US 2017/0150640 A1 May 25, 2017

(30) Foreign Application Priority Data

Nov. 19, 2015 (JP) ................... 2015-226769

(51) Int. Cl.
*H05K 7/20* (2006.01)
*H05K 7/14* (2006.01)
(Continued)

(52) U.S. Cl.
CPC ............. *H05K 7/209* (2013.01); *G01K 1/143* (2013.01); *H01L 23/34* (2013.01); *H05K 7/1427* (2013.01);
(Continued)

(58) Field of Classification Search
USPC ...... 361/676–678, 679.46–679.54, 688–723, 361/752, 760, 762, 831; 174/252, 520,
(Continued)

(56) References Cited

U.S. PATENT DOCUMENTS 5,329,424 A * 7/1994 Patel ...................... H02G 5/025
174/72 B
2005/0135065 A1 * 6/2005 Nakatsu .............. H01L 23/4006
361/703
(Continued)

FOREIGN PATENT DOCUMENTS

JP 52-033089 3/1977
JP 2004-221366 8/2004
(Continued)

OTHER PUBLICATIONS

Japanese Office Action for corresponding JP Application No. 2015-226769, dated Apr. 10, 2017 (w/ English machine translation).
(Continued)

*Primary Examiner* — Dimary Lopez Cruz
*Assistant Examiner* — Zhengfu Feng
(74) *Attorney, Agent, or Firm* — Mori & Ward, LLP

(57) ABSTRACT

A power conversion apparatus includes: a casing that houses an electronic component; a heat sink where the casing is installed, the heat sink dissipating a heat from the electronic component; a substrate disposed on an opposite side of the heat sink in the casing, the substrate including a power converter circuit; a pressing member housed in the casing, the pressing member pressing the electronic component to the heat sink side; and an insulating cover member included in the casing, the insulating cover covering at least a part of the substrate side of the pressing member.

19 Claims, 16 Drawing Sheets

(51) Int. Cl.
  *G01K 1/14* (2006.01)
  *H01L 23/34* (2006.01)
  *H02M 3/335* (2006.01)
  *H02M 1/32* (2007.01)

(52) U.S. Cl.
  CPC .... *H02M 3/33569* (2013.01); *H02M 3/33576* (2013.01); *H02M 2001/327* (2013.01)

(58) Field of Classification Search
  USPC .......................................................... 174/526
  See application file for complete search history.

(56) References Cited

U.S. PATENT DOCUMENTS

| | | | |
|---|---|---|---|
| 2008/0278918 A1 | 11/2008 | Tominaga et al. | |
| 2013/0308275 A1* | 11/2013 | Yamanaka | H05K 7/2039 361/717 |
| 2014/0320150 A1* | 10/2014 | Sato | G01R 31/3696 324/601 |
| 2015/0204915 A1* | 7/2015 | Okuyama | G01R 19/0092 324/117 R |

FOREIGN PATENT DOCUMENTS

| | | |
|---|---|---|
| JP | 2008-273476 | 11/2008 |
| JP | 2009-010252 | 1/2009 |
| JP | 2012-105418 | 5/2012 |
| JP | 2013-243264 | 12/2013 |
| JP | 2014-103270 | 6/2014 |

OTHER PUBLICATIONS

Japanese Office Action for corresponding JP Application No. 2015-226769, dated Jan. 30, 2017 (w/ English machine translation).

* cited by examiner

POWER CONVERSION APPARATUS

CROSS-REFERENCE TO RELATED APPLICATION

This application claims priority from Japanese Patent Application No. 2015-226769 filed with the Japan Patent Office on Nov. 19, 2015, the entire content of which is hereby incorporated by reference.

BACKGROUND

1. Technical Field

The embodiments disclosed herein relate to a power conversion apparatus.

2. Description of the Related Art

Japanese Unexamined Patent Application Publication No. 2013-243264 (FIG. 4) discloses a power conversion apparatus. The power conversion apparatus includes a mounting member, a pressing member, and a fastening member. The mounting member includes a parts housing frame. The parts housing frame houses an electronic component so as to be in contact with at least a part of a side surface of the electronic component that generates a heat during an operation. The parts housing frame holds the electronic component so as to cause a main heat radiating surface of the electronic component to be exposed to a heat sink side. The pressing member is installed on the mounting member. The pressing member simultaneously presses the mounting member and the electronic component on the heat sink side via a heat radiation layer. The fastening member presses the pressing member on the heat sink side to press the parts housing frame and the electronic component to be bonded on the heat radiation layer.

SUMMARY

A power conversion apparatus includes: a casing that houses an electronic component; a heat sink where the casing is installed, the heat sink dissipating a heat from the electronic component; a substrate disposed on an opposite side of the heat sink in the casing, the substrate including a power converter circuit; a pressing member housed in the casing, the pressing member pressing the electronic component to the heat sink side; and an insulating cover member included in the casing, the insulating cover covering at least a part of the substrate side of the pressing member.

DESCRIPTION OF THE EMBODIMENTS

Figure 1:
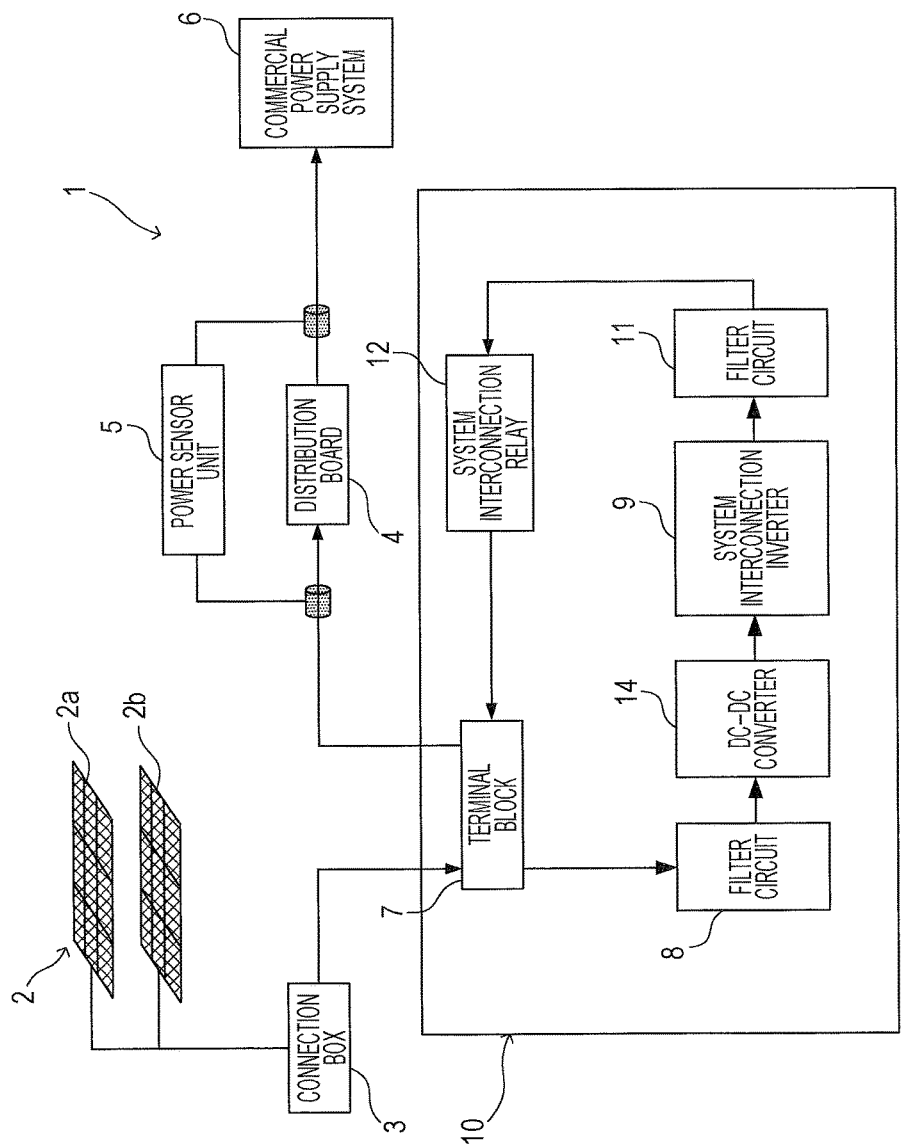
FIG. 1 is an explanatory view illustrating an exemplary system configuration of a solar power generation system that includes a power conditioner device according to the embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A power conversion apparatus according to an embodiment of the present disclosure includes: a casing that houses an electronic component; a heat sink where the casing is installed, the heat sink dissipating a heat from the electronic component; a substrate disposed on an opposite side of the heat sink in the casing, the substrate including a power converter circuit; a pressing member housed in the casing, the pressing member pressing the electronic component to the heat sink side; and an insulating cover member included in the casing, the insulating cover covering at least a part of the substrate side of the pressing member.

A power conversion apparatus according to another embodiment of the present disclosure includes: a casing that houses an electronic component; a heat sink where the casing is installed, the heat sink dissipating a heat from the electronic component; a substrate disposed on an opposite side of the heat sink in the casing, the substrate including a power converter circuit; a pressing member housed in the casing, the pressing member pressing the electronic component to the heat sink side; and a means for insulating the pressing member from the substrate.

According to an aspect of this disclosure, an insulation performance of a power conversion apparatus can be efficiently improved.

The following describes one embodiment with reference to the drawings. In this embodiment, a description will be given of a power conditioner device as an exemplary power conversion apparatus.

<1. Solar Power Generation System>

First, a description will be given of an exemplary system configuration of a solar power generation system 1 that includes a power conditioner device 10 of this embodiment with reference to FIG. 1.

As illustrated in FIG. 1, the solar power generation system 1 includes a solar cell array 2, a connection box 3, the power conditioner device 10, a distribution board 4, and a power sensor unit 5.

The solar cell array 2 includes a plurality of solar cell modules 2a and 2b as a direct current power generation device. FIG. 1 indicates a case where a number of the solar cell module is two as an example. The number of the solar cell module may be one, or three or more. The connection box 3 puts together wirings from the solar cell array 2 in two. The power conditioner device 10 converts a DC power that is supplied from the solar cell array 2 via the connection box 3 into an AC power. The distribution board 4 is disposed on an output side of the power conditioner device 10. The power sensor unit 5 detects an electric power flowing through the distribution board 4. The solar power generation system 1 thus configured can cause the electric power generated by the solar cell array 2 to reversely flow to a commercial power supply system 6.

The power conditioner device 10 includes a terminal block 7, a filter circuit 8, a DC-DC converter 14, a system interconnection inverter 9, a filter circuit 11, and a system interconnection relay 12. The DC-DC converter 14, the system interconnection inverter 9 and the like constitute a power converter circuit of the power conditioner device 10.

To the terminal block 7, the wirings from the solar cell array 2 are coupled, and wirings to the distribution board 4 or the like are also coupled. The filter circuit 8 restrains an electrical noise that leaks to the solar cell array 2 side via the terminal block 7. The DC-DC converter 14 increases and decreases a voltage of the DC power output from the filter circuit 8. The system interconnection inverter 9 converts the DC power output from the DC-DC converter 14 into an AC power corresponding to a frequency of the commercial power supply system 6. The filter circuit 11 restrains the electrical noise of the AC power output from the system interconnection inverter 9. The system interconnection relay 12 turns ON/OFF the connection between the power conditioner device 10 and the commercial power supply system 6.

The above-described configuration of the solar power generation system 1 is merely an example. The configuration of the solar power generation system 1 is not limited to the above contents. For example, the power conditioner device 10 may include a configuration relating to a self-sustained operation and/or a surge suppression circuit that restrains a surge of a thunder or the like, and the like.

<2. Circuit Configuration of DC-DC Converter>

Figure 2:
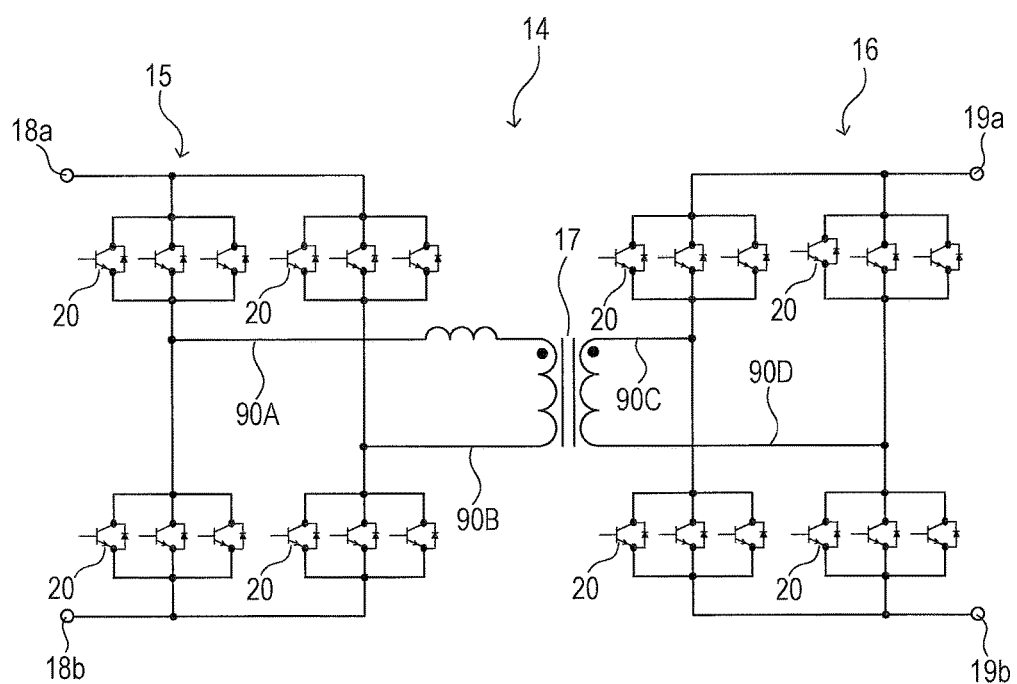
FIG. 2 is an explanatory view illustrating an exemplary circuit configuration of a DC-DC converter disposed on the power conditioner device.

An exemplary circuit configuration of the DC-DC converter 14 will be described with reference to FIG. 2. As illustrated in FIG. 2, the DC-DC converter 14 includes a primary side switching unit 15, a secondary side switching unit 16, and a transformer 17 coupled between the primary side switching unit 15 and the secondary side switching unit 16.

Both the primary side switching unit 15 and the secondary side switching unit 16 are configured to include a plurality of (12, in this example) switching elements 20. As the switching element 20, for example, Field Effect Transistor (FET) or Insulated Gate Bipolar Transistor (IGBT) is used.

The primary side switching unit 15 includes four sets of the switching elements 20 where one set of the switching elements 20 is constituted of three switching elements 20 connected in parallel. The four sets of the switching elements 20 are coupled between input terminals 18a and 18b to constitute a bridge circuit. Two sets of the switching elements 20 among the four sets are coupled to an end of one side of the primary side coil of the transformer 17 by a busbar 90A. The other two sets of the switching elements 20 are coupled to an end of another side of the primary side coil of the transformer 17 by a busbar 90B.

Similarly, the secondary side switching unit 16 includes four sets of the switching elements 20 where one set of the switching elements 20 is constituted of three switching elements 20 connected in parallel. The four sets of the switching elements 20 are coupled between output terminals 19a and 19b to constitute a bridge circuit. Two sets of the switching elements 20 among the four sets are coupled to an end of one side of the secondary side coil of the transformer 17 by a busbar 90C. The other two sets of the switching elements 20 are coupled to an end of another side of the secondary side coil of the transformer 17 by a busbar 90D.

The above-described circuit configuration of the DC-DC converter 14 is merely an example. The circuit configuration of the DC-DC converter 14 is not limited to the above-described contents. For example, in the above example, three switching elements 20 are connected in parallel. Not limiting to this, two switching elements 20 may be connected in parallel, or four or more switching elements 20 may be connected in parallel. Further, the bridge circuit may be configured of four switching elements 20 while each set includes single switching element 20.

<3. Layout of Printed Board of Power Conditioner Device>

An exemplary layout of a printed board 80 disposed on the power conditioner device 10 will be described with reference to FIG. 3.

In the following description, for convenience of the explanation of the device configuration, directions of upper and lower, right and left, and front and back, which are indicated in each drawing, are used as necessary. In this embodiment, an "up-down direction" is a direction perpendicular to a surface direction of the printed board 80. A "front-back direction" is a direction in which a plurality of casings 31 are arranged side by side (direction in which the busbars 90B and 90D are disposed to extend). A "right-left direction" is a direction perpendicular to both directions of the up-down direction and the front-back direction. The "lower" direction is a direction in which a heat sink 60 (see FIG. 4) is arranged with respect to the printed board 80. The "upper" direction is a direction opposite to the direction in which the heat sink 60 is arranged with respect to the printed board 80. The directions do not limit the positional relationship of the device configuration.

Figure 3:
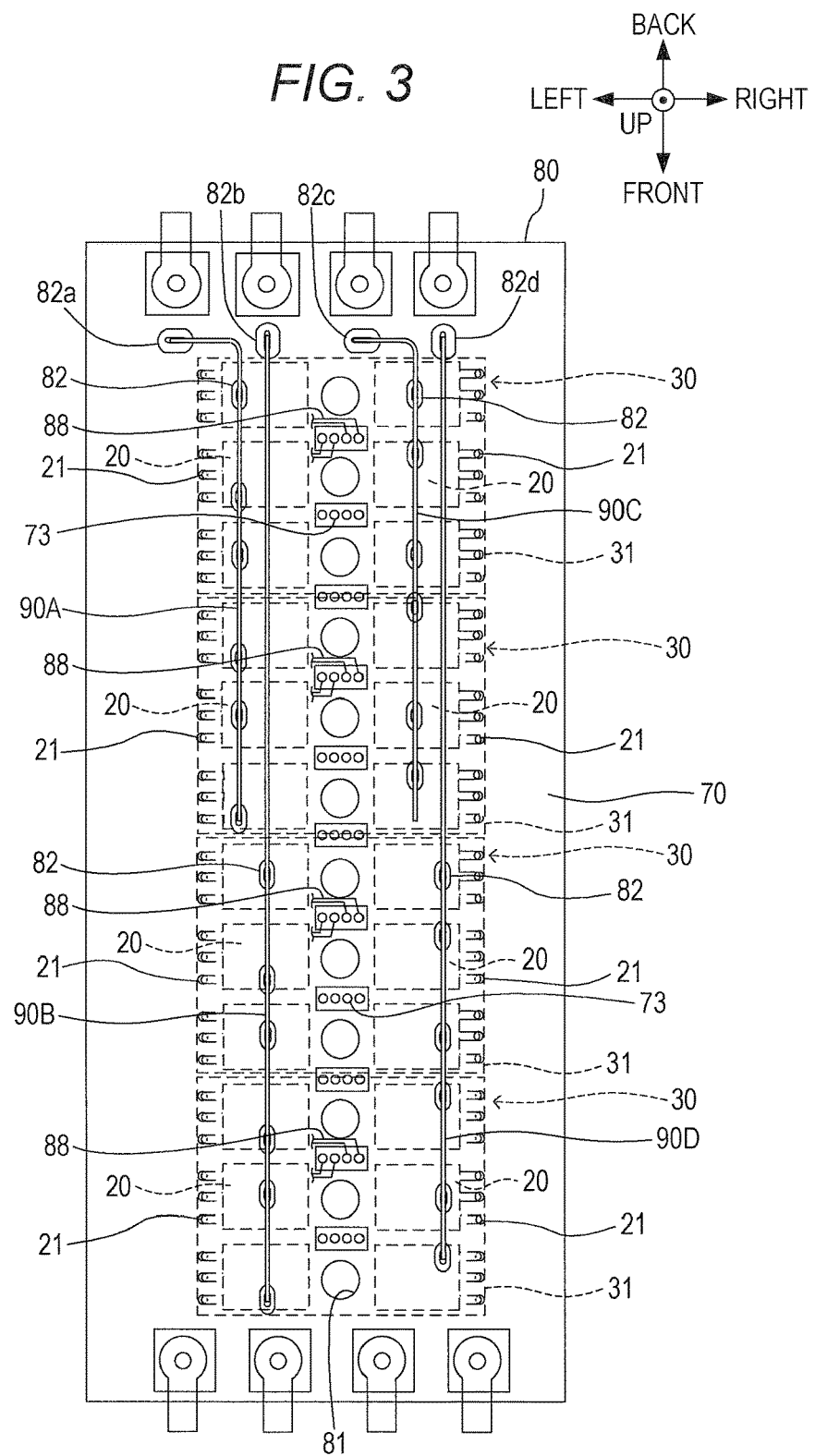
FIG. 3 is a top view illustrating an exemplary layout of a substrate of the power conditioner device.

As illustrated in FIG. 3, 24 pieces of the switching elements 20 (an exemplary electronic component) constituting the DC-DC converter 14 are disposed on the lower side of the printed board 80. The busbars 90A, 90B, 90C, and 90D (an exemplary conductive member) are disposed on the surface of the upper side of the printed board 80. The respective casings 31 house six switching elements 20. One casing 31 and the six switching elements 20 housed in the one casing 31 are included in one switch unit 30. The printed board 80 includes other electronic components constituting the power converter circuit while the electronic components are not illustrated.

The four switch units 30 are disposed on the lower side of the printed board 80 along the front-back direction. The respective casings 31 house three pairs of the switching elements 20 along the front-back direction. Two switching elements 20 constituting the pair of the switching elements 20 are disposed facing one another in the right-left direction. Three switching elements 20 on the left side of the respective casings 31 are connected to one another in parallel by the busbars 90A and 90B disposed on the printed board 80. The three switching elements 20 on the left side of the respective casings 31 constitute the primary side switching unit 15. Similarly, three switching elements 20 on the right side of the respective casings 31 are connected to one another in parallel by the busbars 90C and 90D disposed on the printed board 80. The three switching elements 20 on the right side of the respective casings 31 constitute the secondary side switching unit 16.

In the printed board 80, a plurality of circular-shaped openings 81 is foliated on positions corresponding to circular-shaped openings 35c of the casing 31 (see FIGS. 7 to 9 described later). The opening 81 is an opening for a driver to be inserted through when a leaf spring 50 described later is fastened to the heat sink 60 with a screw. The opening 81 is disposed on an intermediate position of the pair of the switching elements 20. The printed board 80 includes a wiring 88 for a control signal (gate signal) that controls the switching elements 20. The wiring 88 is disposed on a position between the respective openings 81 in the front-back direction, that is an intermediate position of the pair of the switching elements 20 in the right-left direction, and an intermediate position of the pair of the switching elements 20 adjacent to one another in the front-back direction (intermediate position of the leaf springs 50 adjacent to one another in the front-back direction. FIG. 3 illustrates connector holes 73. The connector hole 73 is a hole for a connector (not illustrated) that is disposed on the above-described respective positions and coupled to the wiring 88 for the above-described control signal. A plurality of connector holes 73 is disposed (in this example, four per connector).

The busbar 90A has a shape bent in an approximately L-shape and is arranged on the surface of the printed board 80 closer to the left side. The busbar 90A is coupled to the six switching elements 20 housed in the left side of the two casings 31 in the back side among the four casings 31 arranged side by side in the front-back direction, and an electrode 82a in the back side of the printed board 80. The electrode 82a is an electrode for coupling the busbar 90A to the end of the one side of the primary side coil of the transformer 17.

The busbar 90B has a straight line shape longer than the busbar 90A. The busbar 90B is arranged on the right side of the busbar 90A (opposite side of the bent direction) on the surface of the printed board 80. The busbar 90B is coupled to the six switching elements 20 housed in the left side of the two casings 31 in the front side among the four casings 31 arranged side by side in the front-back direction, and an electrode 82b in the back side of the printed board 80. The electrode 82b is an electrode for coupling the busbar 90B to the end of the other side of the primary side coil of the transformer 17.

The busbar 90C has a shape bent in an approximately L-shape and is arranged on the surface of the printed board 80 closer to the right side. The busbar 90C is coupled to the six switching elements 20 housed in the right side of the two casings 31 in the back side among the four casings 31 arranged side by side in the front-back direction, and an electrode 82c in the back side of the printed board 80. The electrode 82c is an electrode for coupling the busbar 90C to the end of the one side of the secondary side coil of the transformer 17.

The busbar 90D has a straight line shape longer than the busbar 90C. The busbar 90D is arranged on the right side of the busbar 90C (opposite side of the bent direction) on the surface of the printed board 80. The busbar 90D is coupled to the six switching elements 20 housed in the right side of the two casings 31 in the front side among the four casings 31 arranged side by side in the front-back direction, and an electrode 82d in the back side of the printed board 80. The electrode 82d is an electrode for coupling the busbar 90D to the end of the other side of the secondary side coil of the transformer 17.

Figure 4:
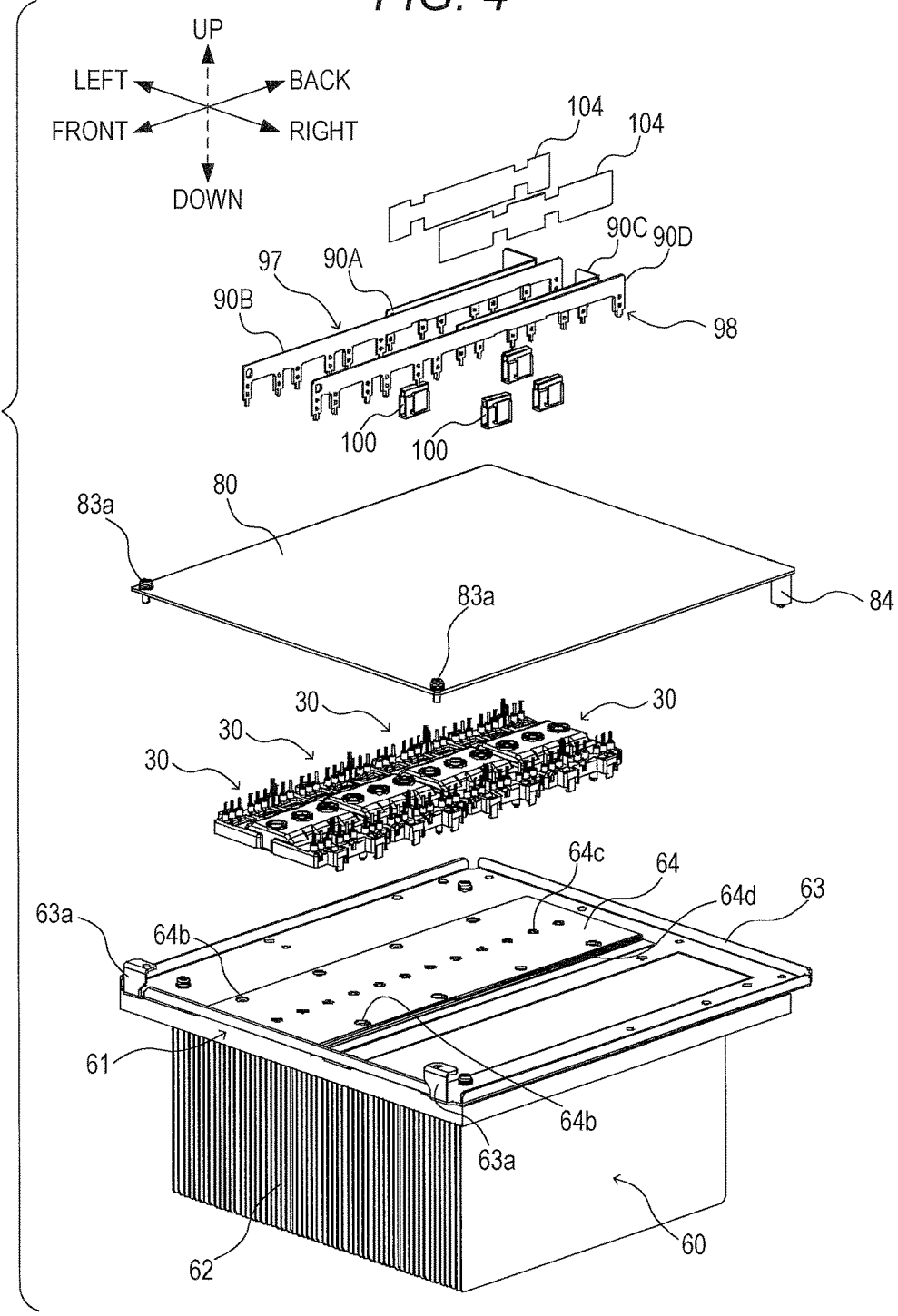
FIG. 4 is an exploded perspective view illustrating an exemplary internal constitution of the power conditioner device.

FIG. 3 omits the illustration of a coupling 100 and an insulating plate member 104 (see FIG. 4 or the like). The coupling 100 couples the busbar 90A to the busbar 90B, and the busbar 90C to the busbar 90D. The insulating plate member 104 is inserted between the busbar 90A and the busbar 90B, and between the busbar 90C and the busbar 90D.

The above-described layout of the printed board 80 is merely an example. The layout of the printed board 80 is not limited to the above contents. For example, the printed board 80 may have a layout where the busbars 90A and 90C also have the straight line shape. Alternatively, the printed board 80 may have a layout where the busbars 90B and 90D are bent as necessary. That is, the shapes of the busbars 90A to 90D are not limited to the above-described shape. The shapes of the busbars 90A to 90D are configured in appropriate shapes corresponding to the layout of the wiring and the parts of the printed board 80 and the arrangement of the switching elements 20 on the lower portion of the printed board 80.

<4. Internal Constitution of Power Conditioner Device>

An exemplary internal constitution of the power conditioner device 10 will be described with reference to FIG. 4. As illustrated in FIG. 4, the power conditioner device 10 includes the heat sink 60, a plurality of (four, in this example) switch units 30, the printed board 80, and a plurality of (two, in this example) busbar units 97 and 98.

The heat sink 60 includes a base 61, a plurality of fins 62, which are arranged side by side, for example, in the right-left direction on the inferior surface of the base 61, and a support member 63. On the top surface of the base 61 closer to the left side, an installation region 64 in, for example, a rectangular shape for installing the switch unit 30 is disposed. The installation region 64 projects to the upper side with respect to the other region of the top surface of the base 61 (see FIG. 10 described below). On both right and left sides of the installation region 64, a plurality of (in this example, two per the casing 31, eight in total) positioning holes 64b for positioning the casing 31 are disposed along the front-back direction. The right and left positioning holes 64b corresponding to one another are disposed to be displaced one another in the front-back direction corresponding to both right and left positioning pins 43 of the casing 31 (see FIGS. 5, 6, and the like described below). On ends of both right and left sides of the installation region 64, locking grooves 64d for locking the casing 31 are disposed along the front-back direction. On the center in the right-left direction of the installation region 64, a plurality of (in this example, twelve) screw holes 64c for locking the leaf spring 50 described later are formed along the front-back direction.

The support member 63 is a member with an approximately rectangular frame shape for supporting the printed board 80 and installed on an upper part of the base 61. On both right and left corner portions in the front end side of the support member 63, hook-shaped substrate fixing portions 63a are disposed projecting upward.

The four switch units 30 are installed on the installation region 64 on the top surface of the base 61 of the heat sink 60 along the front-back direction. Afterwards, the printed board 80 is mounted on the upper side of the four switch units 30. At this time, spacers 84 for keeping the height, which are disposed on the inferior surface of both right and left corner portions on the back end side of the printed board 80, are brought in contact with the top surface of the base 61 of the heat sink 60. Furthermore, both right and left corner portions on the front end of the printed board 80 are placed on the substrate fixing portions 63a of the support member 63. Then, fastening screws 83a inserted through the printed board 80 to the substrate fixing portion 63a secures the printed board 80 to the heat sink 60 while ensuring a housing space of the switch unit 30 between the printed board 80 and the heat sink 60.

The busbar unit 97 includes the busbars 90A and 90B, a plurality of (two, in this example) couplings 100, and the insulating plate member 104 (an exemplary third plate member). The busbar unit 98 includes the busbars 90C and 90D, a plurality of (two, in this example) couplings 100, and the insulating plate member 104 (an exemplary third plate member). The busbars 90A, 90B, 90C, and 90D are installed on the corresponding electrodes on the top surface of the printed board 80. At this time, the busbar 90A and the busbar 90B are preliminarily coupled to one another by the two couplings 100. Furthermore, the insulating plate member 104 is disposed between the busbar 90A and the busbar 90B to insulate the busbar 90A and the busbar 90B one another. The busbars 90A and 90B are installed on the printed board 80 as the busbar unit 97 in this state. Similarly, the busbar 90C and the busbar 90D are preliminarily coupled to one another by the two couplings 100. Furthermore, the insulating plate member 104 is disposed between the busbar 90C and the busbar 90D to insulate the busbar 90C and the busbar 90D one another. The busbars 90C and 90D are installed on the printed board 80 as the busbar unit 98 in this state.

The above-described internal constitution of the power conditioner device 10 is merely an example, and the internal constitution of the power conditioner device 10 is not limited to the above-described contents. For example, the wiring that couples the respective switching elements 20 to the coil of the transformer 17 is not necessarily the busbar. The wiring may be configured with a pattern wiring disposed on the printed board 80.

<5. Configuration of Switch Unit>

Figure 5:
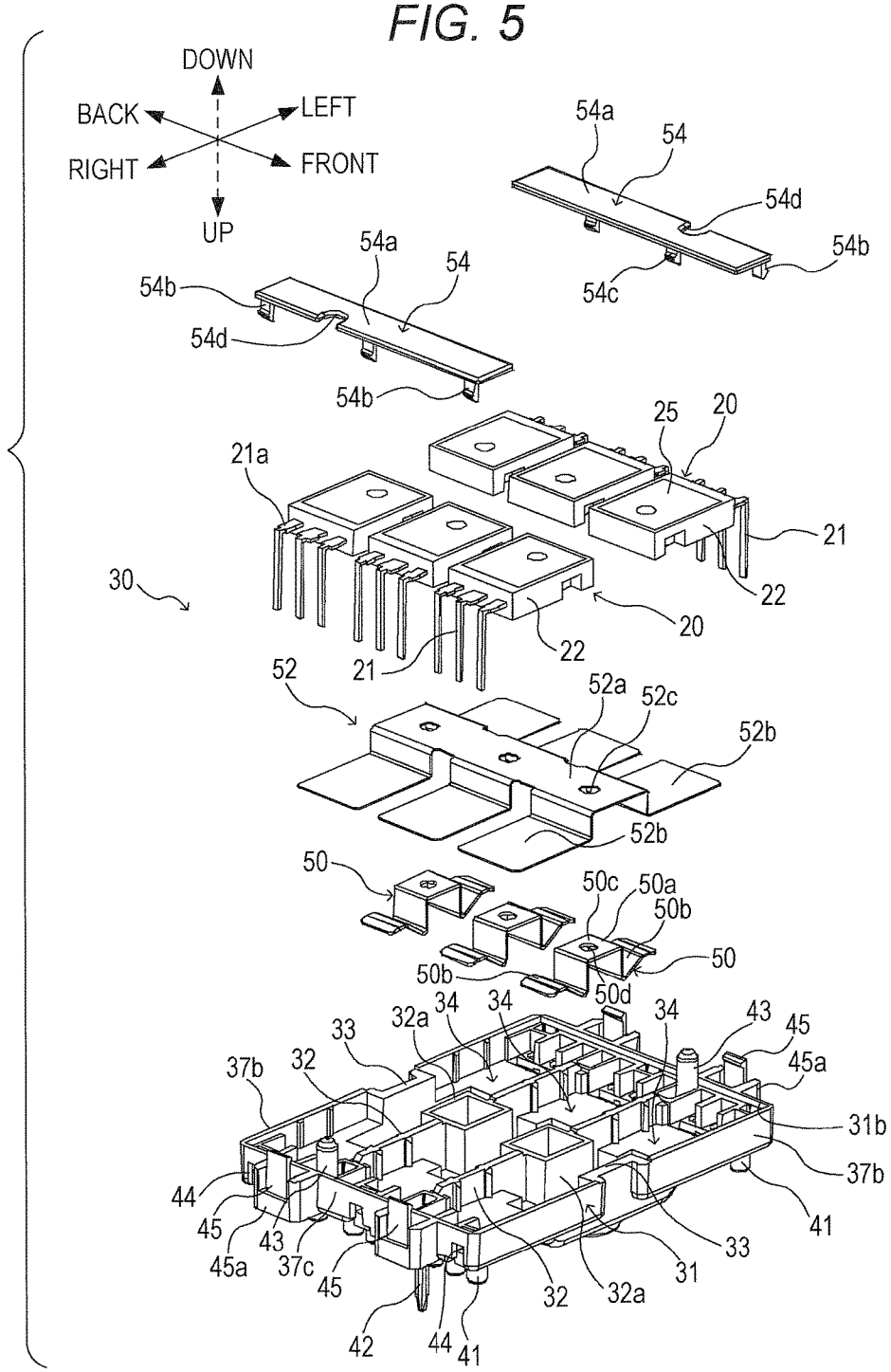
FIG. 5 is an exploded perspective view illustrating an exemplary configuration of a switch unit viewed from a lower side.
Figure 6:
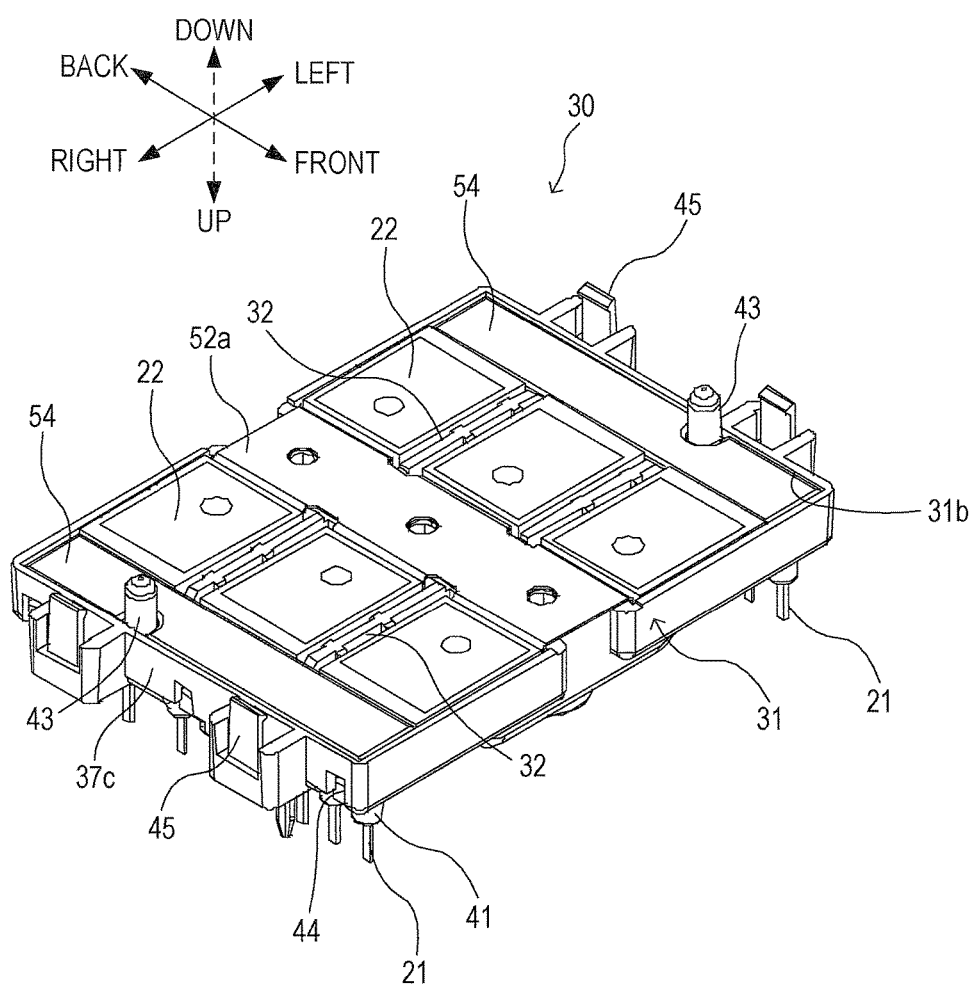
FIG. 6 is a perspective view illustrating the exemplary configuration of the switch unit viewed from the lower side.
Figure 10:
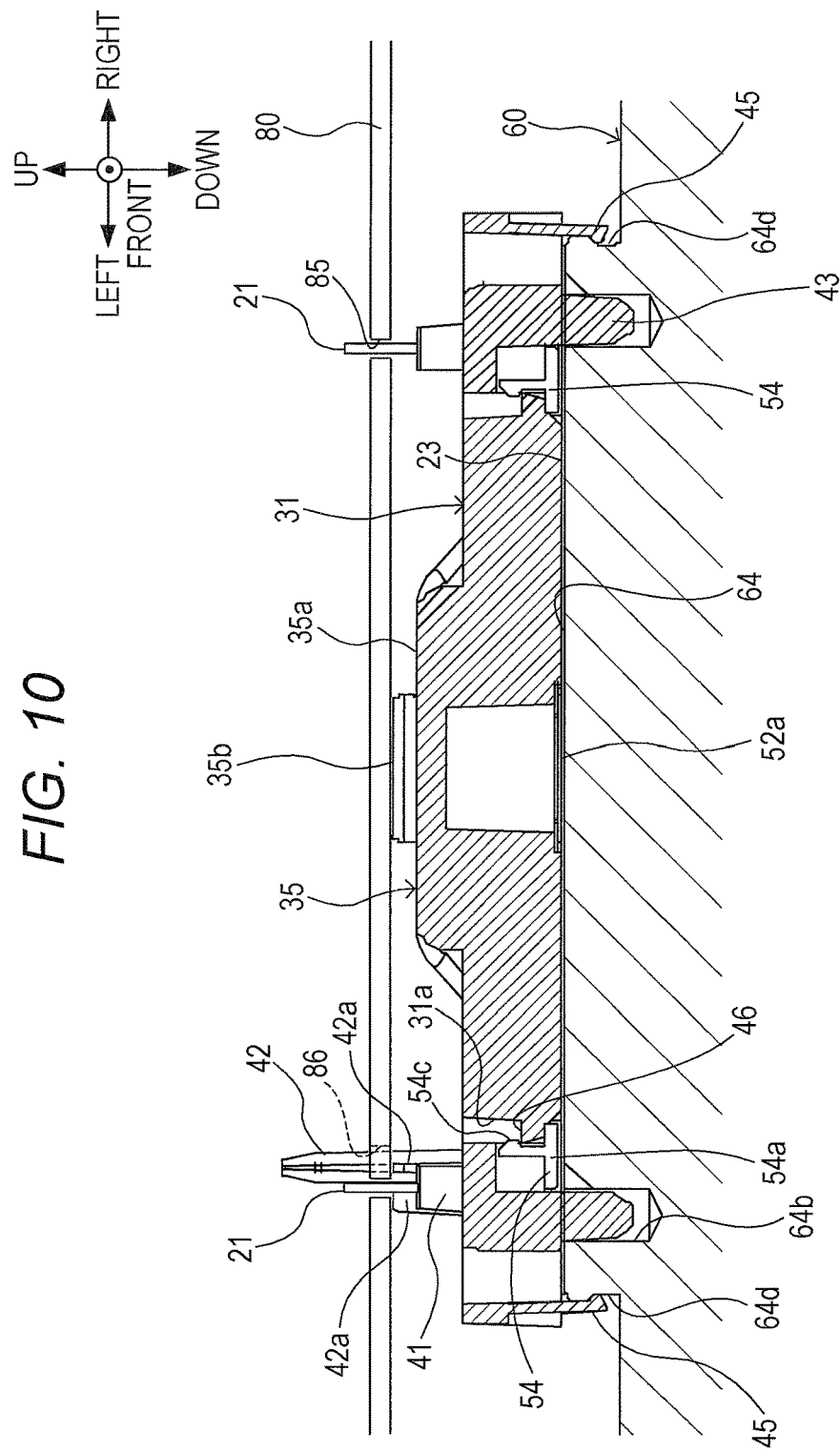
FIG. 10 is a cross-sectional view illustrating the exemplary configuration of the switch unit taken along line B-B in FIG. 8.
Figure 11:
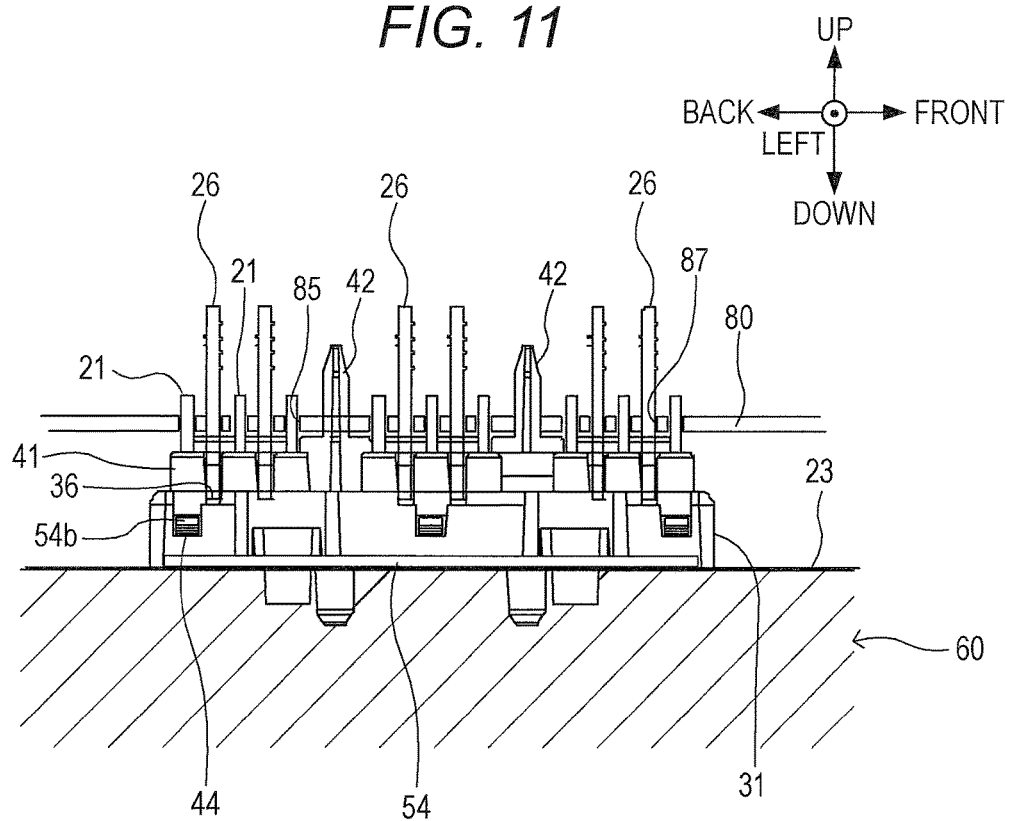
FIG. 11 is a cross-sectional view illustrating the exemplary configuration of the switch unit taken along line C-C in FIG. 9.

An exemplary configuration of the switch unit 30 will be described with reference to FIGS. 5 to 11. FIG. 5 is an exploded perspective view illustrating the switch unit 30 viewed from a lower side. FIG. 6 is a perspective view illustrating the switch unit 30 viewed from the lower side. FIG. 7 is a perspective view illustrating the switch unit 30 viewed from an upper side. FIG. 8 is a plan view illustrating the switch unit 30 viewed from the upper side. FIG. 9 is a cross-sectional view taken along line A-A in FIG. 8. FIG. 10 is a cross-sectional view taken along line B-B in FIG. 8. FIG. 11 is a cross-sectional view taken along line C-C in FIG. 9. FIGS. 9 to 11 illustrate the switch unit 30 disposed between the printed board 80 and the heat sink 60. Directions of front and back, right and left, and upper and lower indicated in FIGS. 5 to 11 correspond to the above-described directions indicated in FIGS. 3 and 4.

As illustrated in FIG. 5, the switch unit 30 includes the casing 31, six switching elements 20, three leaf springs 50 (an exemplary pressing member), one insulating plate member 52 (an exemplary second plate member), and two resin covers 54. The switch unit 30 includes the casing 31 and the above-described switching elements 20 and the like housed in the casing 31.

As illustrated in FIGS. 5 and 6, the casing 31 is a chassis, where the lower side is opened, in a flat and approximately rectangular parallelepiped shape, and formed of an insulating material. As illustrated in FIGS. 7 to 10, the casing 31 integrally includes a cover 35 (cover member, an exemplary means for insulating the pressing member and the printed board one another). The cover 35 is disposed on a center of a top surface 37a and has a shape bulging upward. The cover 35 is formed of the insulating material identical to the casing 31. The cover 35 covers at least a part of the printed board 80 side of the leaf springs 50 housed in the casing 31. The cover 35 may be disposed independent of the casing 31.

As the insulating material of the casing 31 (the cover 35), a resin or the like is used. The insulating material of the casing 31 may be a material with a high insulation resistance compared with the leaf spring 50.

The cover 35 of the casing 31 includes a plate-shaped cover main body 35a and a contacting portion 35b. The cover main body 35a is disposed to extend along a surface direction of the printed board 80. The contacting portion 35b projects from the cover main body 35a to the printed board 80 side and is brought in contact with the lower side surface of the printed board 80. On the inside of the contacting portion 35b, the circular-shaped opening 35c is formed. The opening 35c penetrates the cover 35 in the up-down direction. The opening 35c is an opening for inserting the driver in fastening the leaf spring 50 to the heat sink 60 with the screw. As described above, the opening 35c is disposed on the position corresponding to the opening 81 of the printed board 80.

Figure 8:
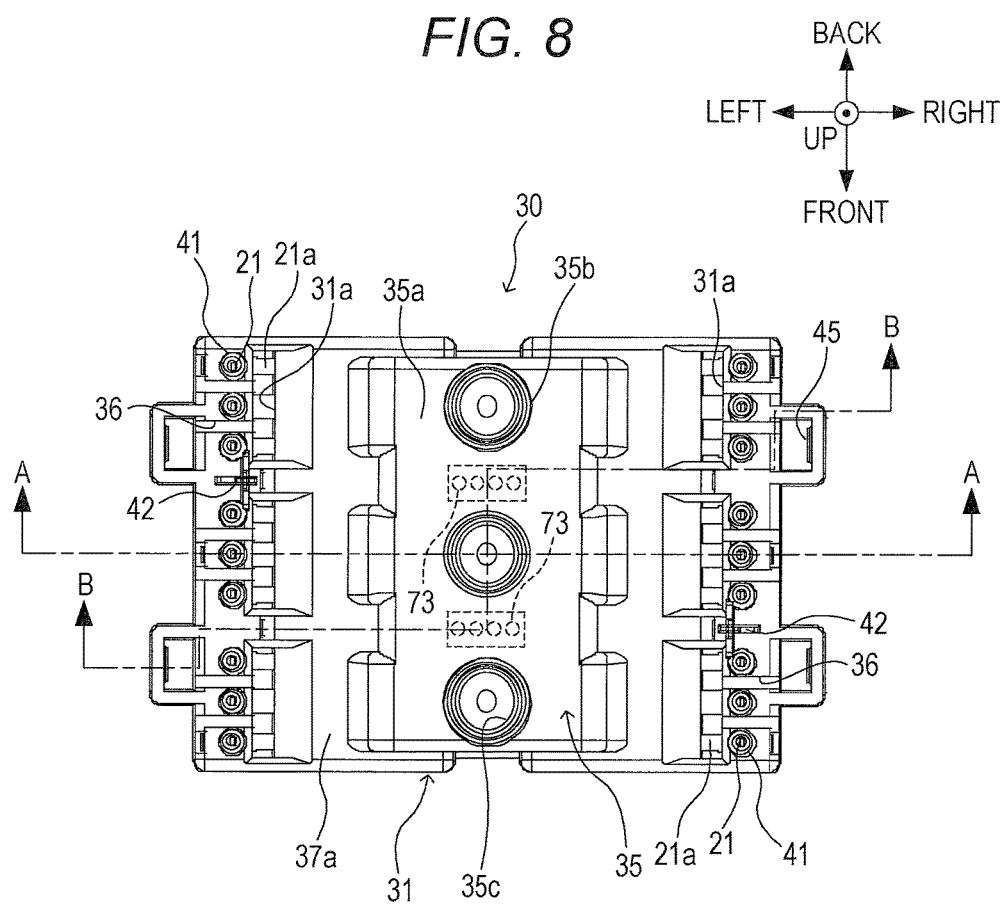
FIG. 8 is a top view illustrating the exemplary configuration of the switch unit.

As illustrated in FIG. 8, at least on a position on the printed board 80 corresponding to the wiring 88 for the control signal (position corresponding to the connector hole 73), in other words, at least on a position corresponding to the middle of the leaf springs 50 adjacent to one another in the front-back direction, the cover main body 35a of the cover 35 is disposed to extend so as to cover the printed board side of the leaf spring 50. Thus, the cover main body 35a ensures an insulation distance between the leaf spring 50 and the printed board 80.

The contacting portion 35b is formed in an annular shape in a plan view viewed from the upper side (the printed board 80 side). A part of the contacting portion 35b contacting the printed board 80 has a substantial line shape (circular shape, in this example) in a plan view viewed from the upper side. The shape of the contacting portion 35b is not limited to the annular shape, and may be a multangular shape, for example, a square or the like. The contacting portion 35b may have a shape contacting the printed board 80 with a surface by, for example, increasing the area of a part of the contacting portion 35b contacting the printed board. That is, the part of the contacting portion 35b contacting the printed board 80 may have a planar shape in a plan view viewed from the upper side.

As illustrated in FIG. 5, an internal space of the casing 31 is divided into three in the front-back direction by two partition walls 32. The partition wall 32 has a polygonal tube 32a on the center, and is disposed to extend in the right-left direction. Front and back side walls 37b of the casing 31 include an approximately rectangular-shaped protrusion 33 inside on the respective centers in the right-left direction. The protrusion 33 projects toward the polygonal tube 32a. The partition walls 32 and the protrusions 33 form three element housing portions 34 in the internal space of the casing 31 along the front-back direction. The element housing portion 34 houses a pair of the switching elements 20.

Figure 7:
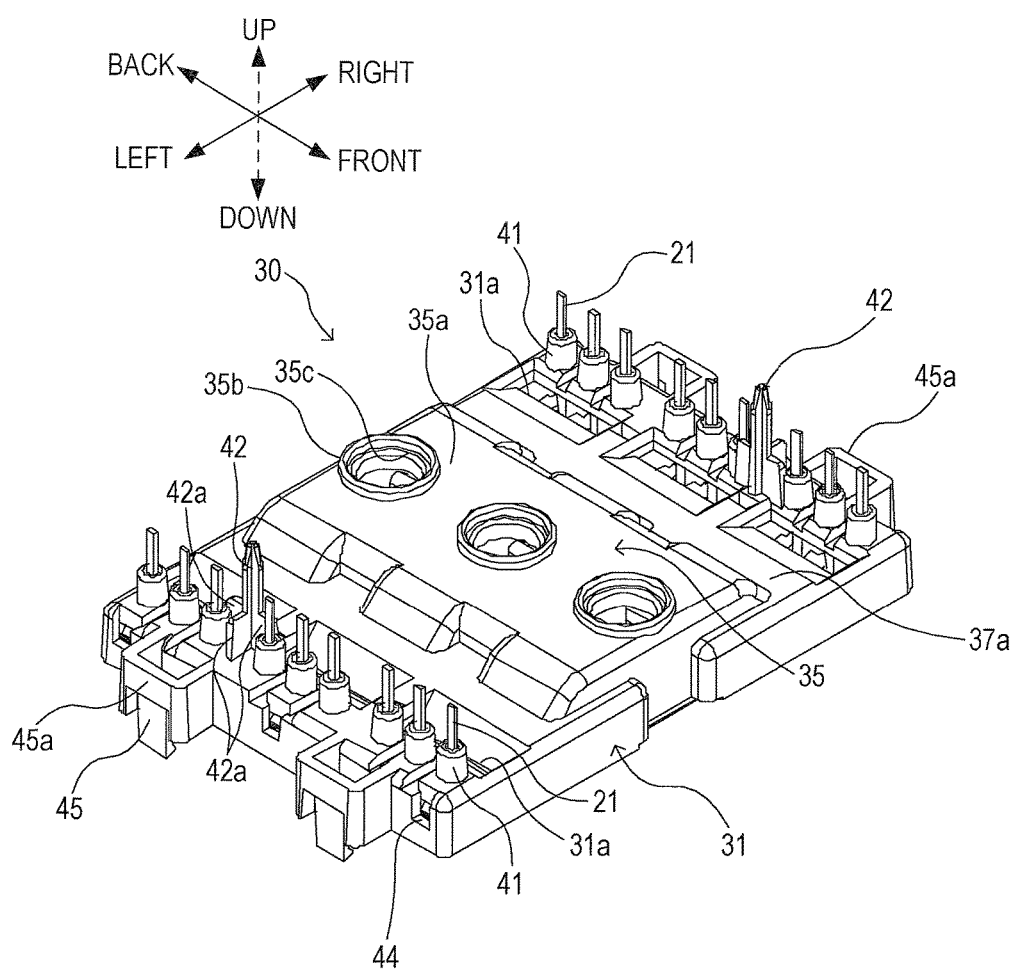
FIG. 7 is a perspective view illustrating the exemplary configuration of the switch unit viewed from an upper side.

As illustrated in FIGS. 7 and 8, on both right and left sides of the top surface 37a of the casing 31, a plurality of lead guides 41 (an exemplary guide) are disposed along the front-back direction. Six sets of lead guides 41, where one set is constituted of three lead guides 41 disposed with a predetermined interval in the front-back direction, are disposed corresponding to each of the six switching elements 20 housed in the casing 31. The lead guide 41 is a hollow cylindrical member projecting upward. As illustrated in FIG. 9, the lead guide 41 includes a guide bore 41a. Into the guide bore 41a, a lead 21 of the switching element 20 housed in the casing 31 is inserted. The lead guide 41 leads the lead 21 to the printed board 80 side installed on the casing 31 through the guide bore 41a. This causes the lead guide 41 to determine the projecting position of the lead 21, which projects from the lead guide 41, to the printed board 80 side on a position of a through-hole 85 disposed on the printed board 80.

As illustrated in FIGS. 7 and 8, on both right and left sides of the top surface 37a of the casing 31, two guide pins 42 (an exemplary protrusion) projecting upward are disposed. The two guide pins 42 are disposed to be displaced such that the positions are different from one another in the front-back direction. In this example, the left side guide pin 42 is disposed on the intermediate position of the two sets of the lead guides 41 in the back side on the left end of the casing 31. The right side guide pin 42 is disposed on the intermediate position of the two sets of the lead guides 41 in the front side on the right end of the casing 31. The position of the guide pin 42 is not limited to the above-described position. The two guide pins 42 may be disposed so as to be positioned on a diagonal in a plan view of the casing 31, or may be disposed such that the two guide pins 42 are disposed on an identical position in the front-back direction, for example. The number of the guide pin 42 may be three or more.

The guide pin 42 is formed in a tapered shape such that the guide pin 42 is easily inserted into a positioning hole 86 of the printed board 80. The guide pin 42 includes a plurality of (three, in this example) support pieces 42a where the printed board 80 is placed on the bases of the support pieces 42a. As illustrated in FIG. 10, the guide pin 42 is formed such that the projection height of the guide pin 42 to the printed board 80 side is higher than the projection height of the lead 21 to the printed board 80 side. The support piece 42a is formed to have the projection height approximately identical to the projection height of the contacting portion 35b of the cover 35. The guide pin 42 is inserted into the positioning hole 86 (see FIG. 10) formed on the printed board 80. This causes the guide pin 42 to determine the position of the casing 31 and the printed board 80. The support piece 42a is in contact with a lower side surface of the printed board 80. Then, the support piece 42a supports the printed board 80 with the contacting portion 35b such that the printed board 80 is disposed approximately parallel to the base 61 of the heat sink 60. This ensures stably supporting the printed board 80, and at the same time, ensures determining the position of the printed board 80 in the up-down direction.

As illustrated in FIGS. 5 and 6, on the lower portion of right and left side walls 37c of the casing 31, the two positioning pins 43 in an approximately column-shape are disposed projecting downward. The two positioning pins 43 are disposed to be displaced such that the positions are different from one another in the front-back direction. As illustrated in FIG. 10, the positioning pins 43 are fitted to the positioning holes 64b formed on the installation region 64 of the heat sink 60. This causes the positioning pin 43 to position the casing 31 to the heat sink 60. The position of the positioning pin 43 is not limited to the positions indicated in FIGS. 5 and 6. The two positioning pins 43 may be disposed so as to be positioned on a diagonal in a plan view of the casing 31, or may be disposed such that the two positioning pins 43 are disposed on an identical position in the front-back direction, for example. The number of the positioning pin 43 may be three or more.

As illustrated in FIGS. 5 to 7, the right and left side walls 37c of the casing 31 include a plurality of (three, in this example) engaging holes 44 for installing the resin cover 54. The engaging holes 44 are disposed on both ends in the front-back direction and the center of the side wall 37c. The right and left side walls 37c of the casing 31 include a plurality of (two, in this example) locking claws 45 for installing the casing 31 to the heat sink 60. The locking claw 45 is a hook-shaped projecting piece projecting downward from the inside of a frame 45a in an approximately rectangular parallelepiped shape. The locking claw 45 is disposed between the engaging holes 44 adjacent to one another. As illustrated in FIG. 10, the locking claw 45 is engaged with the locking groove 64d on both sides in the right-left direction of the installation region 64 of the heat sink 60. This causes the locking claw 45 to secure the casing 31 to the heat sink 60.

The above-described positioning pin 43 and locking claw 45 can easily decide the position of the respective casings 31 and secure the respective casings 31 to the heat sink 60. This eliminates the need for securing the casing 31 to the heat sink 60 with the screw to ease the securing work and ensure reducing assembling man-hours.

As illustrated in FIG. 5, the switching element 20 includes an approximately rectangular parallelepiped circuit 22, a heating element (not illustrated), three leads 21, and a copper plate 25. The circuit 22 is made of resin and seals a peripheral area of the heating element. The three leads 21 project from a side wall of the circuit 22 to be bent in an L-shape. The copper plate 25 for a heat radiation, which mounts the heating element, is exposed on a lower side surface of the circuit 22. The copper plate 25 is integrally coupled to one of the three leads 21 (the lead 21 on the center, for example). As illustrated in FIG. 9, the switching element 20 is installed on the heat sink 60 such that the copper plate 25 faces downward. A heat of the heating element is transmitted from the copper plate 25 to the heat sink 60 via an insulating heat radiation sheet 23. This ensures insulation between the circuit 22 of the switching element 20 and the heat sink 60, and efficiently radiates the heat of the switching element 20.

As illustrated in FIGS. 5 and 6, the casing 31 houses the three pairs of the switching elements 20. The two switching elements 20 constituting the pair of the switching elements 20 are disposed mutually opposing along a right-left direction along a surface direction of the printed board 80 (an exemplary first direction). The three pairs of the switching elements 20 are disposed in parallel along a front-back direction along the above-described surface direction and perpendicular to the right-left direction (an exemplary second direction). That is, the three pairs of the switching elements 20 are housed in the casing 31 per pair. At this time, the circuit 22 of the pair of the switching elements 20 is housed in the element housing portion 34 of the casing 31. As illustrated in FIG. 6, a lower side surface of the circuit 22 of the switching element 20 housed in the casing 31 is exposed on the lower side of the casing 31.

As illustrated in FIGS. 5 and 6, the insulating plate member 52 (an exemplary second plate member) is, for example, a plate material with a flexibility constituted of an insulating material of a resin or the like. The insulating plate member 52 is housed in the casing 31 so as to be arranged between an upper side surface of the circuit 22 of the switching element 20 and the leaf spring 50. The insulating plate member 52 includes an approximately rectangular-shaped flat plate 52a extending in the front-back direction, and three pairs of L-shaped bent pieces 52b. The bent pieces 52b are disposed on both right and left ends of the flat plate 52a integrated with the flat plate 52a with an interval in the front-back direction. As illustrated in FIG. 9, the flat plate 52a is arranged between the leaf spring 50 and the insulating heat radiation sheet 23. The bent pieces 52b are arranged between the leaf spring 50 and the circuit 22. The bent pieces 52b are arranged so as to cover an approximately entire surface of the top surface and a side surface inside in the right-left direction of the circuit 22. As illustrated in FIG. 5, a through hole 52c is formed on a position on the center of the flat plate 52a in the right-left direction corresponding to the bent piece 52b. A screw for securing the leaf spring 50 is inserted into the through hole 52c.

Figure 9:
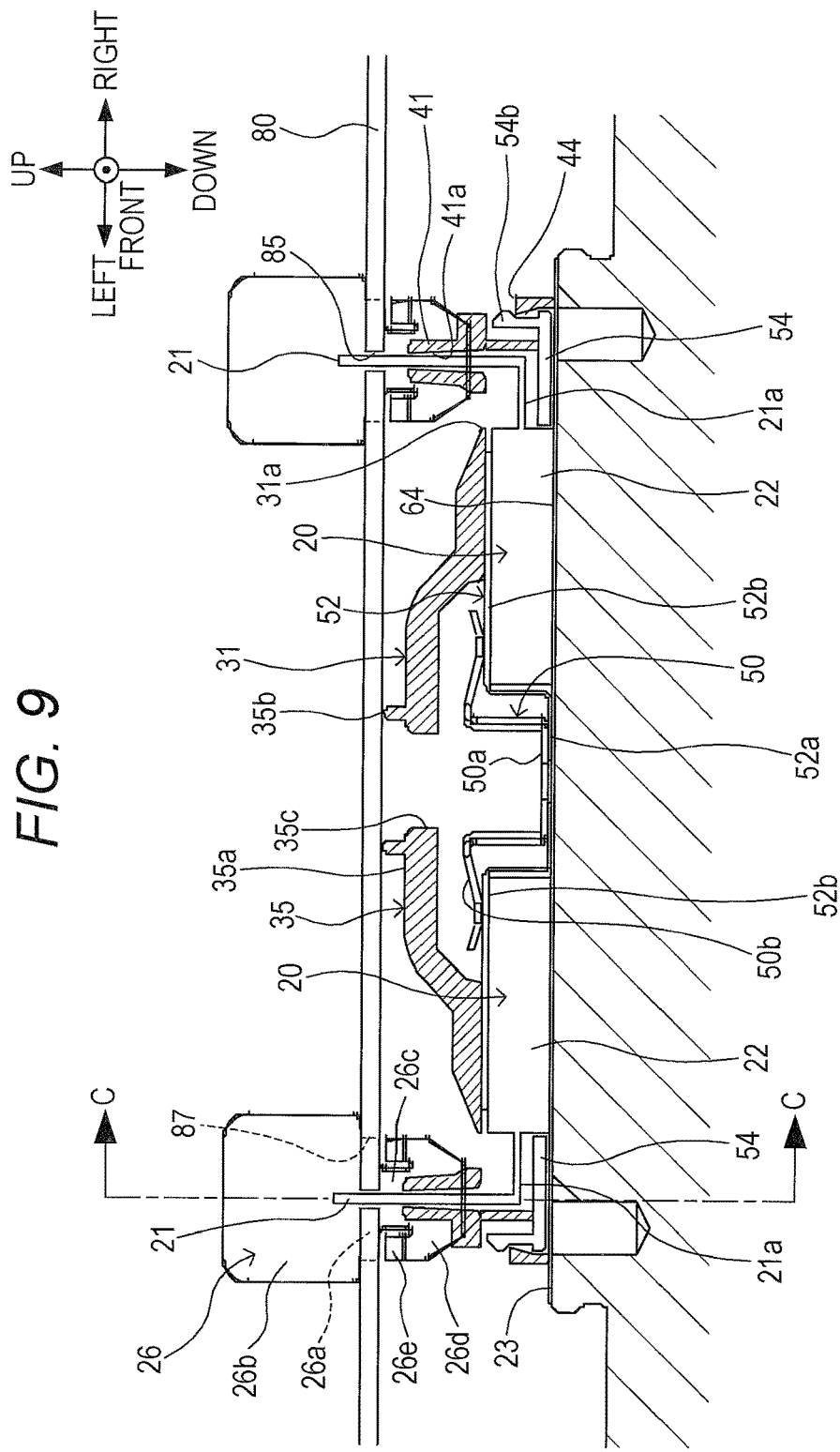
FIG. 9 is a cross-sectional view illustrating the exemplary configuration of the switch unit taken along line A-A in FIG. 8.

As illustrated in FIGS. 5 and 9, the leaf spring 50 (an exemplary pressing member) is housed in the casing 31 to be arranged on the middle of the pair of the switching elements 20. The leaf spring 50 presses the pair of the switching elements 20 to the heat sink 60 side. The leaf spring 50 is, for example, made of metal. However, the leaf spring 50 may be constituted of the other material of the resin or the like. The leaf spring 50 includes an approximately U-shaped main body 50a and a pair of pressing pieces 50b. The pressing pieces 50b are disposed on both right and left sides of the main body 50a so as to be folded back in a lower surface 50c side. The pressing pieces 50b are brought in contact with an upper side surface of the circuit 22 of the switching element 20 via the bent pieces 52b of the insulating plate member 52. The pressing piece 50b has an elastic force to press the circuit 22 to the heat sink 60 side. The main body 50a includes the lower surface 50c where a through hole 50d is formed. The leaf spring 50 is housed in the element housing portion 34 of the casing 31 per the pair of the switching elements 20. That is, three leaf springs 50 are housed in the casing 31.

Fastening the screw (not illustrated), which is inserted into the through hole 50d and the through hole 52c of the insulating plate member 52, to the screw hole 64c of the heat sink 60 (see FIG. 4) fastens the respective leaf springs 50 together with the insulating plate member 52 to secure to the heat sink 60. At this time, the leaf spring 50 is determined the position between the polygonal tube 32a of the casing 31 and the protrusion 33. This restrains the rotation of the leaf spring 50 caused by fastening with the screw.

In the above-described example, the leaf spring 50 has a shape configured to press the two switching elements 20. However, the shape of the leaf spring 50 is not limited to this. The leaf spring 50 may have a shape similar to the insulating plate member 52, for example. In this case, the leaf spring 50 may have a shape configured to press the three or more switching elements 20 (for example, four or six). The leaf spring 50 may be configured such that the one leaf spring 50 presses the one switching element 20.

As illustrated in FIG. 5, the two resin covers 54 have an identical shape to one another. The two resin covers 54 are disposed so as to have a positional relationship of a point symmetry on a surface parallel to the printed board 80 with an axis extending in the up-down direction as a symmetrical axis. The respective resin covers 54 include an approximately rectangular-shaped cover 54a extending in the front-back direction, three locking claws 54b, and two locking claws 54c. The three locking claws 54b are disposed upright on three positions of both ends and a center in the front-back direction in one end side of the cover 54a in the right-left direction. The two locking claws 54c are disposed upright on two positions in the front-back direction in the other end side of the cover 54a in the right-left direction (in this example, positions corresponding to between the locking claws 54b adjacent to one another in the front-back direction). An arc-like cut-out hole 54d is formed on a position between the two locking claws 54b in the one end side of the cover 54a in the right-left direction. To the cut-out hole 54d, the positioning pin 43 of the casing 31 is fitted. A number of the locking claws 54b and 54c may be a number other than the above-described number.

As illustrated in FIGS. 6, and 9 to 11, on the resin cover 54, the locking claw 54c is engaged with a stepped portion 46 (see FIG. 10) disposed inside the casing 31. Furthermore, the locking claw 54b is engaged with an engaging hole 44 disposed on the right and left side walls 37c of the casing 31. This installs the resin cover 54 on an opening 31b of the casing 31 on the heat sink 60 side. Then, the cover 54a covers at least the heat sink 60 side of a base end 21a of the lead 21 (see FIG. 9).

As illustrated in FIGS. 7 to 10, on both right and left sides of the top surface 37a of the casing 31, an inlet 31a is formed. The inlet 31a is configured to inject a resin with an insulation property (such as a silicon rubber) into at least the base end 21a of the lead 21 of the housed switching element 20. The inlets 31a are formed on six positions corresponding to the respective switching elements 20. The above-described resin cover 54 restrains the resin injected from the inlet 31a from leaking from the opening 31b of the casing 31.

As illustrated in FIGS. 9 and 11, the respective leads 21 of the switching elements 20, which are housed in the casing 31, include parts projecting from the casing 31, and approximately flat-plate-shaped barrier members 26 (an exemplary first plate member) are disposed between the projecting parts. The barrier member 26 is constituted of an insulating material of the resin or the like. The barrier member 26 is removably fastened to the printed board 80. As illustrated in FIG. 9, the barrier member 26 includes a base 26a, an approximately rectangular-shaped upper plate 26b, a lower plate 26d, and a pair of engaging portions 26e. The base 26a is fitted to a slit-shaped opening 87 in the right-left direction disposed on the printed board 80. The upper plate 26b is disposed on an upper part of the base 26a, and in contact with the top surface of the printed board 80. The lower plate 26d is disposed on a lower part of the base 26a via a supporter 26c. The lower plate 26d is fitted to a groove 36 (see FIGS. 8 and 11) between the lead guides 41 of the casing 31 adjacent to one another. The pair of the engaging portions 26e are disposed on both right and left sides of the supporter 26c. The pair of the engaging portions 26e are engaged with the inferior surface of the printed board 80 on a position displaced in the front-back direction in the inferior surface side of the printed board 80.

When the barrier member 26 is attached on and removed from the printed board 80, an elastic deformation occurs to make the positions of the pair of the engaging portions 26e on the printed board 80 to be identical in the front-back direction. This allows the pair of the engaging portions 26e to pass through the opening 87. Then, the barrier member 26 can be easily attached on and removed from the printed board 80. Fitting the lower plate 26d to the groove 36 of the casing 31 restrains the barrier member 26 from shaking in the front-back direction in installing the printed board.

The configuration of the switch unit 30 and the like has been described above in detail. However, the above-described configuration is merely an example, and the configuration of the switch unit 30 and the like is not limited to the above-described contents. For example, a number of the switching element 20 housed in the casing 31 may be other than six. That is, all the switching elements 20 (24, in the above example) may be housed in the single casing 31. Alternatively, each casing 31 may house a small number of the switching elements 20 compared with six (one or four, for example). Alternatively, each casing 31 may house a large number of the switching elements 20 compared with six (eight or twelve, for example).

<6. Configuration and Assembling Method of Busbar Unit>

A description will be given of an exemplary configuration and assembling method of the busbar units 97 and 98 with reference to FIGS. 12 to 17. The busbar unit 97 and the busbar unit 98 have a similar configuration and are assembled with a similar method. Accordingly, the following describes the busbar unit 97 and omits the explanation of the busbar unit 98.

Figure 12:
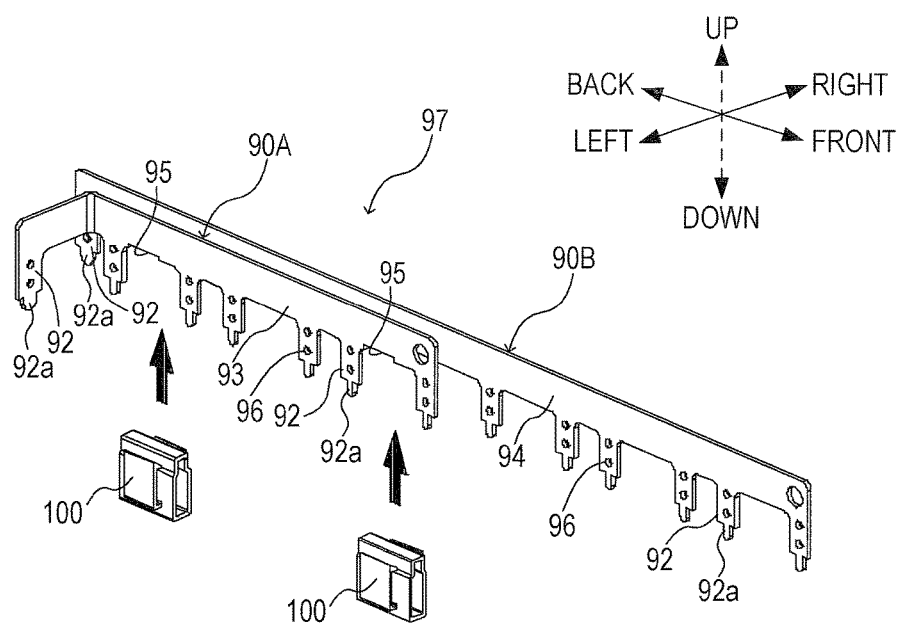
FIG. 12 is an explanatory view illustrating an exemplary assembling method of a busbar unit.
Figure 13:
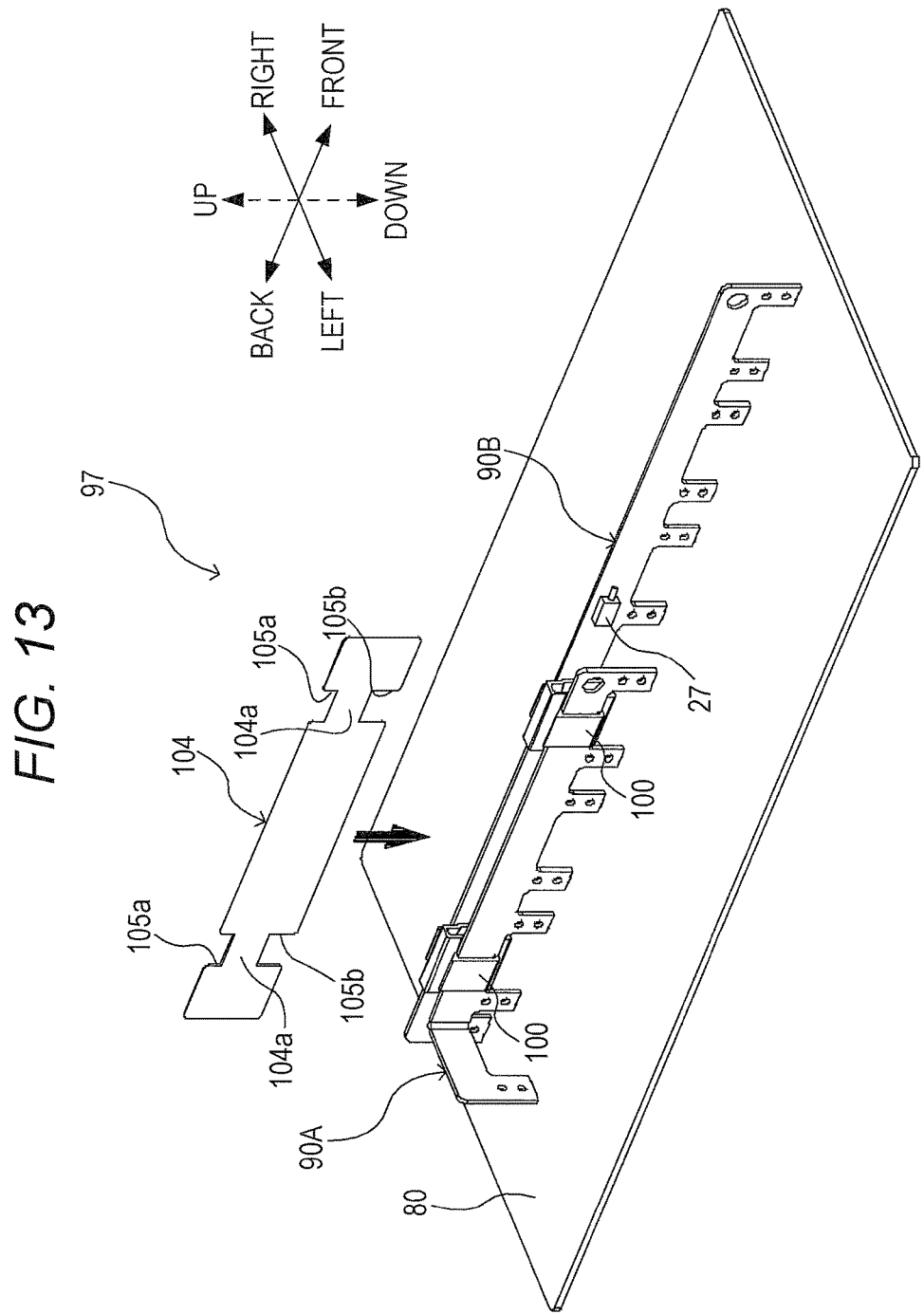
FIG. 13 is an explanatory view illustrating the exemplary assembling method of the busbar unit.
Figure 14:
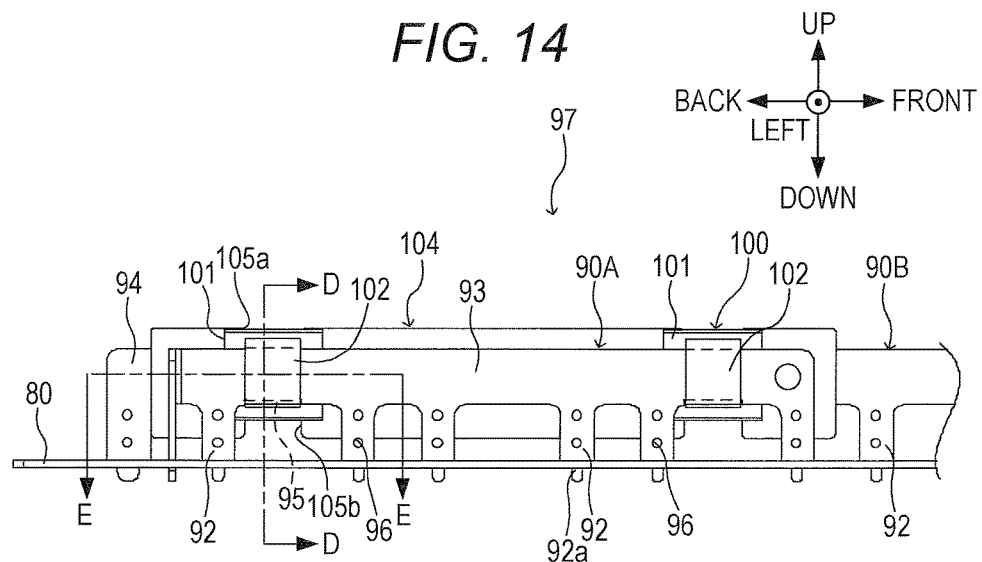
FIG. 14 is a left side view illustrating an exemplary configuration of the busbar unit.
Figure 15:
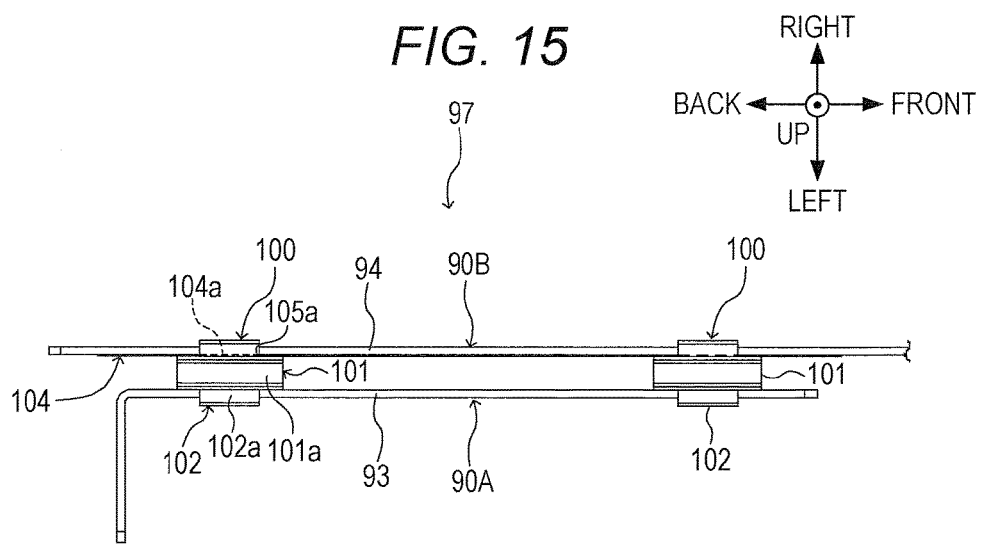
FIG. 15 is a top view illustrating the exemplary configuration of the busbar unit.
Figure 16:
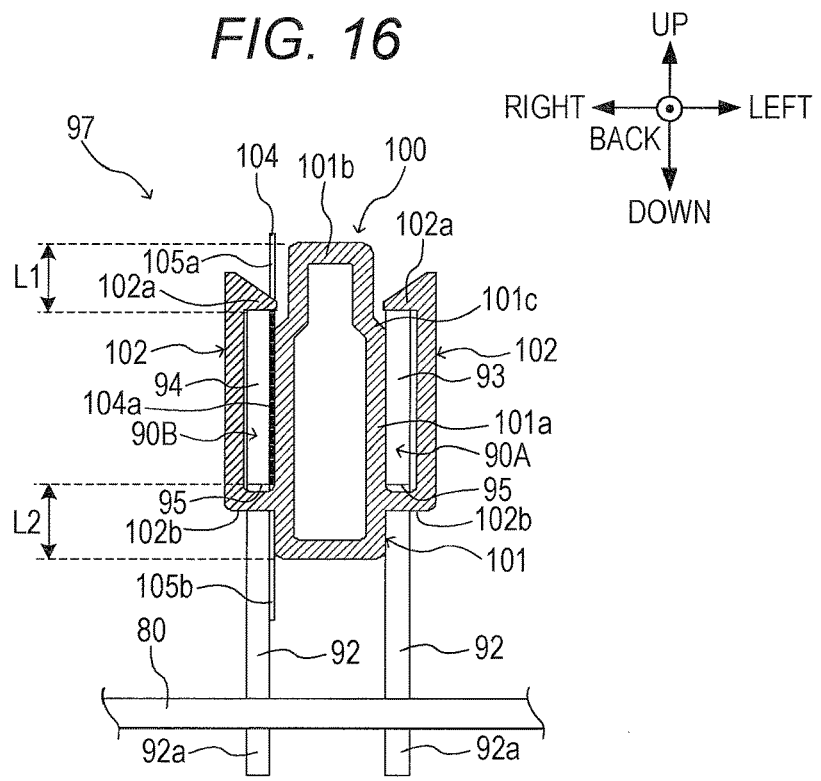
FIG. 16 is a cross-sectional view illustrating the exemplary configuration of the busbar unit taken along line D-D in FIG. 14.
Figure 17:
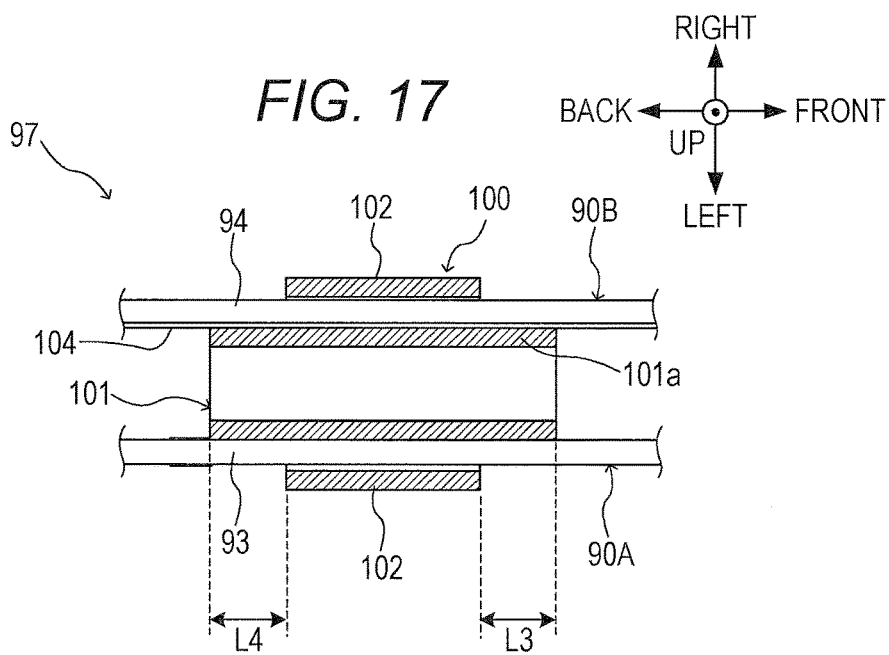
FIG. 17 is a cross-sectional view illustrating the exemplary configuration of the busbar unit taken along line E-E in FIG. 14.

FIG. 12 is an explanatory view illustrating an exemplary assembling method of the busbar unit 97. FIG. 13 is an explanatory view illustrating the exemplary assembling method of the busbar unit 97. FIG. 14 is a left side view illustrating an exemplary configuration of the busbar unit 97. FIG. 15 is a top view illustrating the exemplary configuration of the busbar unit 97. FIG. 16 is a cross-sectional view taken along line D-D in FIG. 14. FIG. 17 is a cross-sectional view taken along line E-E in FIG. 14. Directions of front and back, right and left, and upper and lower indicated in FIGS. 12 to 17 correspond to the above-described directions indicated in FIGS. 3 and 4.

A plate thickness (thickness in the right-left direction) of the busbar 90A and the busbar 90B is configured based on a skin depth corresponding to a frequency of a high frequency electric current flowing through the busbar 90A and the busbar 90B. For example, the plate thickness of the busbars 90A and 90B is configured to be approximately double of the skin depth. This reduces an influence of a skin effect where the electric current is concentrated on a surface of a conductive member as increasing the frequency of the high frequency electric current. The same applies to the plate thickness of the busbars 90C and 90D.

As illustrated in FIG. 12, the busbar 90A includes a plurality of (seven, in this example) legs 92 and a bridge 93 bridged across the plurality of legs 92. The bridge 93 is formed in an approximately L-shape where the rear side is bent short in the left direction. A plate width of the bridge 93 in the up-down direction is appropriately configured depending on the amount of the high frequency electric current flowing through the busbar 90A. The plurality of legs 92 of the busbar 90A are coupled to six electrodes 82 (see FIG. 3) and the electrode 82a. The six electrodes 82 correspond to the respective switching elements 20 disposed on the upper side surface of the printed board 80. The electrode 82a is similarly disposed on the rear side of the upper side surface of the printed board 80. The electrode 82a is electrically coupled to an end of the one side of the primary side coil of the transformer 17.

The busbar 90B includes a plurality of (seven, in this example) legs 92 and a bridge 94 bridged across the plurality of legs 92. In this example, the bridge 94 is approximately double of the above bridge 93 in length and linearly formed. A plate width of the bridge 94 in the up-down direction is appropriately configured depending on the amount of the high frequency electric current flowing through the busbar 90B. The plurality of legs 92 of the busbar 90B are coupled to the six electrodes 82 (see FIG. 3) and the electrode 82b. The six electrodes 82 correspond to the respective switching elements 20 disposed on the upper side surface of the printed board 80. The electrode 82b is similarly disposed on the rear side of the upper side surface of the printed board 80. The electrode 82b is electrically coupled to an end of the other side of the primary side coil of the transformer 17.

The respective legs 92 include the lower end on which an inserted portion 92a, which is small in width compared with the leg 92, is disposed. The inserted portion 92a is inserted into the electrode 82 (or the electrode 82a or the electrode 82b). In the respective legs 92, an opening 96 for restraining heat conduction in a soldering is formed. In this embodiment, the number of the opening 96 formed in the respective legs 92 is two. However, the number of the opening 96 is not limited to this and may be one, or three or more.

The bridge 93 of the busbar 90A includes approximately rectangular-shaped cut-outs 95 so as to decrease the plate width of the bridge 93 in the up-down direction. The cut-outs 95 are disposed on lower ends of two positions of the bridge 93, between the two legs 92 of front and back in the front side, and between the two legs 92 of front and back in the rear side. Similarly, the bridge 94 of the busbar 90B includes the cut-outs 95 in an identical shape. The cut-outs 95 of the busbar 90B are disposed on lower ends of positions (two positions) of the busbar 90B corresponding to the cut-outs 95 of the busbar 90A in a state where the busbar 90B is installed on the printed board 80.

As illustrated in FIG. 12, the busbar 90A is coupled to the busbar 90B with the coupling 100 on the two positions in the front-back direction where the above cut-outs 95 are disposed. After that, as illustrated in FIG. 13, the plurality of legs 92 of the coupled busbar 90A and busbar 90B are inserted into the corresponding electrodes 82, 82a, and 82b on the top surface of the printed board 80. This disposes the respective legs 92 upright on the printed board 80. Then, the insulating plate member 104 is inserted and installed between the coupled busbar 90A and busbar 90B, in detail, between the busbar 90B and the coupling 100. Then, the respective legs 92 are soldered to the electrodes 82, 82a, and 82b corresponding to the respective legs 92. The insulating plate member 104 may be installed after the soldering.

As illustrated in FIG. 13, the bridge 94 of the busbar 90B includes a temperature sensor 27 that detects a temperature of the busbar 90B. The temperature sensor 27 is arranged on a position above the leg 92. The temperature sensor 27 can detect a heat transmitted from the heating element of the switching element 20 to the busbar 90B via the copper plate 25, the lead 21 integrated with the copper plate 25, and the pattern wiring of the printed board 80 (not illustrated, copper foil or the like). The heat transfer route includes only a conductive member with a high thermal conductivity. Accordingly, the heat resistance of this route is comparatively small. Then, the temperature sensor 27 can detect the heat of the switching element 20 with high accuracy. The type of the temperature sensor 27 is not specifically limited. As the temperature sensor 27, such as a thermistor is employed.

The coupling 100 is constituted of an insulating material of the resin or the like. As illustrated in FIGS. 14 to 17, the coupling 100 includes a spacer 101, and two locking claws 102. The spacer 101 is inserted between the bridge 93 of the busbar 90A and the bridge 94 of the busbar 90B. The two locking claws 102 are coupled to both right and left sides of the spacer 101 to be locked to the bridges 93 and 94. As illustrated in FIG. 16, the spacer 101 is formed as a tubular body with a hollow wall structure where both ends in the front-back direction are opened. The spacer 101 includes a spacer main body 101a, a spacer head 101b, and an inclined portion 101c. The spacer head 101b is disposed on the upper side of the spacer main body 101a and small in size in the right-left direction compared with the spacer main body 101a. The inclined portion 101c couples the spacer main body 101a to the spacer head 101b.

As illustrated in FIG. 16, the spacer 101 is large in size in the up-down direction compared with the size of the bridge 93 of the busbar 90A and the bridge 94 of the busbar 90B in the up-down direction. Then, the coupling 100 is installed on the busbars 90A and 90B such that the upper end of the spacer 101 projects upward by a predetermined size L1 with respect to the upper end of the bridges 93 and 94, and at the same time, the lower end of the spacer 101 projects downward by a predetermined size L2 with respect to the lower end (the cut-out 95) of the bridges 93 and 94. This ensures a creepage distance in the up-down direction between the bridge 93 and the bridge 94 on a part where the coupling 100 is installed (parts of cut-outs 105a and 105b of the insulating plate member 104, described later).

As illustrated in FIG. 17, the size of the spacer 101 in the front-back direction is greater than the size of the locking claw 102 in the front-back direction. The size of the locking claw 102 in the front-back direction is approximately identical to the size of the cut-outs 95 of the bridges 93 and 94, and the cut-outs 105a and 105b of the insulating plate member 104 in the front-back direction. As a result, when the coupling 100 is installed on the busbars 90A and 90B, the front end of the spacer 101 projects forward by a predetermined size L3 with respect to the front end of the locking claw 102. Furthermore, the rear end of the spacer 101 projects backward by a predetermined size L4 with respect to the rear end of the locking claw 102. This ensures a creepage distance in the front-back direction between the bridge 93 and the bridge 94 on a part where the coupling 100 is installed (parts of the cut-outs 105a and 105b of the insulating plate member 104, described later).

As illustrated in FIG. 16, the locking claw 102 is formed so as to have an approximately L-shaped cross section perpendicular to the front-back direction. The locking claw 102 includes a stop 102a on the upper end, and a fitted portion 102b on the lower end. The stop 102a projects inward toward proximity of the inclined portion 101c of the spacer 101, and is locked to the upper end of the bridges 93 and 94. The size of the locking claw 102 in the front-back direction is approximately identical to the size of the cut-out 95 of the bridges 93 and 94 in the front-back direction. The fitted portion 102b is fitted to the cut-out 95. The size in the up-down direction between the top surface of the fitted portion 102b and the inferior surface of the stop 102a is approximately identical to the size of the bridge 93 and the bridge 94 in the up-down direction. The locking claws 102 house the bridges 93 and 94 between the locking claw 102 and the spacer 101 while holding the bridges 93 and 94 between the fitted portion 102b and the stop 102a. This causes the locking claw 102 to fasten the spacer 101 to the bridges 93 and 94.

The insulating plate member 104 is, for example, a plate material constituted of an insulating material of the resin or the like. As illustrated in FIGS. 14 and 15, the size of the insulating plate member 104 in the front-back direction is greater than the size of the busbar 90A in the front-back direction. Furthermore, the size of the insulating plate member 104 in the up-down direction is greater than the size of the bridges 93 and 94 in the up-down direction. However, as illustrated in FIG. 13, the insulating plate member 104 includes approximately rectangular-shaped cut-outs 105a and cut-outs 105b on respective upper parts and lower parts of two positions in the front-back direction. A narrow portion 104a between the cut-outs 105a and 105b is approximately identical to the bridges 93 and 94 in size in the up-down direction. The sizes of the cut-outs 105a and 105b in the front-back direction are approximately identical to the size of the locking claw 102 of the coupling 100 in the front-back direction.

As illustrated in FIG. 13, the insulating plate member 104 is inserted between the bridge 94 of the busbar 90B and the spacer main body 101a of the coupling 100 from above on a position where the two narrow portions 104a of front and back correspond to the locking claws 102 of the two couplings 100. At this time, the fitted portion 102b of the locking claw 102 is fitted to the cut-out 105b of the insulating plate member 104. Furthermore, the stop 102a of the locking claw 102 is locked to the cut-out 105a of the insulating plate member 104 (the upper end of the narrow portion 104a). This locks and installs the insulating plate member 104 to the locking claw 102 of the coupling 100.

As illustrated in FIG. 16, the installed insulating plate member 104 projects upward the spacer 101 except the parts coupled by the coupling 100, and extends to an approximately intermediate position of the leg 92 in the up-down direction. As illustrated in FIG. 14, the installed insulating plate member 104 projects and extends to both sides of the bridge 94 of the busbar 90A in the front-back direction. This ensures the creepage distance between the bridge 93 and the bridge 94. As described above, on the parts coupled by the coupling 100, the coupling 100 ensures the creepage distance.

The configuration of the busbar unit 97 (same applies to the busbar unit 98) has been described above in detail. However, the above-described configuration is merely an example, and the configuration of the busbar unit 97 is not limited to the above contents. For example, the number of the part coupled by the coupling 100 in the busbar unit 97 may be one, or three or more. It is not necessary to couple the busbar 90A to the busbar 90B. That is, the coupling 100 may not be used.

<7. Advantageous Effect of Embodiment>

As described above, the power conditioner device 10 according to this embodiment includes the casing 31, which houses the plurality of switching elements 20, the heat sink 60, where the casing 31 is installed and dissipates the heat from the switching elements 20, the printed board 80, which is disposed on the opposite side of the heat sink 60 in the casing 31 and includes the power converter circuit, the leaf spring 50, which is housed in the casing 31 and presses the switching elements 20 to the heat sink 60 side, the insulating cover 35, which is included in the casing 31 and covers at least a part of the printed board 80 side of the leaf spring 50. This provides the following advantageous effects.

That is, in the power conditioner device 10 according to this embodiment, the casing 31 installed on the heat sink 60 houses the plurality of switching elements 20. The heat from the switching elements 20 is dissipated by the heat sink 60. Furthermore, the leaf spring 50 housed in the casing 31 presses the switching elements 20 to the heat sink 60 side. In the case where the leaf spring 50 is made of metal, securing the leaf spring 50 to the heat sink 60 with the screw causes the leaf spring 50 to have a ground potential (housing potential). Accordingly, it is preferred to ensure insulation to the earth between the printed board 80 with the power converter circuit as a main circuit potential and the leaf spring 50 to restrain the occurrence of an earth fault or the like.

In this embodiment, the casing 31 includes the insulating cover 35 that covers at least a part of the printed board 80 side of the leaf spring 50. This ensures an insulation distance between the leaf spring 50 and the printed board 80. As a result, the insulation performance of the power conditioner device 10 can be efficiently improved.

In this embodiment, especially, the cover 35 includes the cover main body 35a and the contacting portion 35b that projects from the cover main body 35a to the printed board 80 side to be brought in contact with the printed board 80. This provides the following advantageous effects.

That is, in this embodiment, the cover 35 includes the cover main body 35a and the contacting portion 35b. The cover 35 is disposed to extend along the surface direction of the printed board 80. This causes the cover 35 to cover the printed board 80 side of the leaf spring 50 while the cover 35 is interposed between the leaf spring 50 and the printed board 80 to ensure the insulation distance between the leaf spring 50 and the printed board 80. The contacting portion 35b projects from the cover main body 35a to the printed board 80 side to be brought in contact with the printed board 80. This forms (ensures) the clearance between the cover main body 35a and the printed board 80. Accordingly, the space can be ensured between the printed board 80, and the cover 35 and the like. The space can be used as, for example, an arrangement space for the circuit parts and/or a projecting space for the leads of the circuit parts (the inserted portion 92a of the leg 92 of the busbars 90A to 90D or the like).

In this embodiment, especially, the part of the contacting portion 35b contacting the printed board 80 has a linear shape in a plan view viewed from the printed board 80 side. This increases the contacted area of the contacting portion 35b with the printed board 80 to stably support the printed board 80.

In this embodiment, especially, the printed board 80 includes the wiring 88 for the control signal to control the switching elements 20, and the cover 35 includes the cover main body 35a on the position corresponding to the wiring 88. This provides the following advantageous effects.

That is, the wiring 88 for the control signal (gate signal) to control the switching elements 20 has the main circuit potential. Then, it is preferred to ensure the insulation distance between the wiring 88 and the leaf spring 50. In this embodiment, the cover 35 includes the cover main body 35a on the position corresponding to the wiring 88. This ensures the insulation distance between the wiring 88 and the leaf spring 50 to restrain the occurrence of the earth fault or the like.

In this embodiment, especially, the casing 31 houses three pairs of the switching elements 20, where the pair of the switching elements 20 includes two switching elements disposed mutually opposing in the right-left direction, so as to be arranged in parallel along the front-back direction. The leaf spring 50 is arranged on the middle of the respective pairs of the switching elements. The leaf spring 50 presses the pairs of the switching elements 20 to the heat sink 60 side. The printed board 80 includes the wiring 88 for the control signal (gate signal) on the positions corresponding to the middle of the leaf springs 50 adjacent to one another in the front-back direction. The cover main body 35a is disposed to extend at least on the position corresponding to the middle of the leaf springs 50 adjacent to one another in the front-back direction. This provides the following advantageous effects.

That is, in this embodiment, the printed board 80 includes the wiring 88 for the control signal, which controls the respective pairs of the switching elements 20, on the positions corresponding to the middle of the leaf springs 50 adjacent to one another in the front-back direction. This arranges the wiring 88 on the intermediate position in the right-left direction. Accordingly, the circuit configuration can be facilitated compared with a case where the wiring 88 is disposed divided into both right and left sides with respect to the respective pairs of the switching elements 20. For example, connector points can be decreased, and circuit patterns can be decreased. On the position of the printed board 80 corresponding to the leaf spring 50, the opening 81 for fastening the screw that secures the leaf spring 50 can be formed. This ensures securing the leaf springs 50 and the switching elements 20 to the heat sink 60 after arranging the printed board 80. Then, the degree of freedom of the assembling work can be improved.

This embodiment employs the configuration where the leaf springs 50 press the switching elements 20 by pair (two) without employing a configuration where the leaf spring 50 as one member presses all the switching elements 20 at a time. This provides a pressing force to each switching element 20 approximately evenly to improve the reliability.

In this embodiment, especially, the power conditioner device 10 is removably secured to the printed board 80, and includes the insulating barrier member 26 disposed between the parts, which are included in the lead 21 of the switching element 20 housed in the casing 31, projecting from the casing 31.

According to this embodiment, the barrier member 26 ensures the insulation distance between lines of the parts of the leads 21 of the respective switching elements 20 projecting from the casing 31, and the insulation distance between the electrodes (not illustrated) to which the leads 21 of the printed board 80 are coupled. This further improves the insulation performance of the power conditioner device 10. The configuration where the barrier member 26 is removable with respect to the printed board 80 allows the barrier member 26 to be removed from the printed board 80 when the lead 21 is soldered on the printed board 80. This restrains the barrier member 26 from decreasing the workability of the soldering.

In this embodiment, especially, the power conditioner device 10 is housed in the casing 31 and includes the insulating plate member 52 arranged between the surface of the switching element 20 in the opposite side of the heat sink 60 and the leaf spring 50. This ensures the insulation distance between the copper plate 25 (main circuit potential) on the surface of the switching element 20 in the heat sink 60 side and the leaf spring 50 (ground potential). Then, the insulation performance of the power conditioner device 10 can be further improved.

In this embodiment, especially, the casing 31 includes the lead guide 41 that determines the projecting position of the lead 21 of the housed switching element 20 to the printed board 80 side on the position of the through-hole 85 formed on the printed board 80. This provides the following advantageous effects.

That is, when the printed board 80 is installed on the casing 31, the respective leads 21 of the plurality of switching elements 20, housed in the casing 31, are inserted through the through-hole 85 of the printed board 80. In this embodiment, the casing 31 includes the lead guide 41. This ensures determining the position of the respective leads 21 on the position of the through-hole 85 of the printed board 80 with high accuracy. Furthermore, the bend, the inclination, and the like of the projected lead 21 can be restrained and corrected. This facilitates the installation work of the printed board 80 on the casing 31.

In this embodiment, especially, the casing 31 includes the two guide pins 42 inserted into the positioning hole 86 formed on the printed board 80, and the guide pin 42 is configured such that the projection height of the guide pin 42 to the printed board 80 side is higher than the projection height of the lead 21.

According to this embodiment, inserting the guide pin 42 of the casing 31 into the positioning hole 86 of the printed board 80 determines the position of the casing 31 and the printed board 80. Disposing two or more guide pins 42 determines the position of the casing 31 and the printed board 80 not only in the right-left direction and the front-back direction but also in the rotation direction (rotation direction around an axis along the up-down direction). Furthermore, the guide pin 42 is configured such that the projection height of the guide pin 42 to the printed board 80 side is higher than the projection height of the lead 21. Accordingly, after the insertion of the guide pin 42 into the positioning hole 86 determines the position of the casing 31 and the printed board 80, the respective leads 21 of the switching elements 20 (positioned by the lead guide 41) are inserted through the through-hole 85 of the printed board 80. This further facilitates the installation work of the printed board 80 to the casing 31.

In this embodiment, especially, the switching element 20 includes three leads 21 coupled to the printed board 80, and the casing 31 includes the inlet 31a configured to inject the insulating resin into at least the base end 21a of the lead 21 of the housed switching element 20.

This allows the insulating resin to be injected from the inlet 31a of the casing 31 after the casing 31 is secured to the heat sink 60. Then, the resin can be filled at least between the base ends 21a of the leads 21 of the switching elements 20. As a result, the insulation distances between the lines of the three leads 21 of the switching elements 20 inside the casing 31 can be ensured. This further improves the insulation performance of the power conditioner device 10.

In this embodiment, especially, the power conditioner device 10 is installed on the opening 31b of the casing 31 in the heat sink 60 side, and includes the resin cover 54 that covers at least the heat sink 60 side of the base end 21a of the lead 21.

According to this embodiment, the resin cover 54 restrains the resin injected from the inlet 31a from leaking out from the opening 31b of the casing 31. This improves the reliability of ensuring the insulation between the lines of the leads 21 of the switching elements 20.

In this embodiment, especially, the power conditioner device 10 includes the busbars 90A to 90D that constitute a part of the power converter circuit, and the busbars 90A to 90D include the plurality of legs 92 disposed upright on the printed board 80 and the bridges 93 and 94 bridged across the plurality of legs 92. This provides the following advantageous effects.

That is, on the top surface of the printed board 80, for example, the wiring 88 for the control signal (gate signal) that controls the switching element 20 is disposed. Then, in a case where the wiring for the input/output electric current to the switching element 20, which causes the noise, is disposed on the top surface of the printed board 80, the noise possibly provides the influence on the control signal.

In this embodiment, the busbars 90A and 90B, which include the leg 92 and the bridges 93 and 94, are disposed on the printed board 80. This allows the bridges 93 and 94 to be separated from the surface of the printed board 80 by the length of the leg 92. Accordingly, flowing the input/output electric current to the switching element 20 through the busbars 90A and 90B reduces the influence of the noise on the control signal.

In this embodiment, especially, the power conditioner device 10 includes the insulating coupling 100 that couples the busbar 90A to the busbar 90B (the busbar 90C to the busbar 90D), and the coupling 100 includes the spacer 101 inserted between the bridge 93 of the busbar 90A and the bridge 94 of the busbar 90B, which are adjacent to one another, and the two locking claws 102 coupled to the spacer 101 and locked to the two bridges 93 and 94.

Coupling the plurality of busbars 90A and 90B (the busbars 90C and 90D) with the coupling 100 improves the stability of the busbars 90A and 90B (the busbars 90C and 90D), which are disposed upright on the printed board 80, before the soldering. This restrains the busbars 90A and 90B (the busbars 90C and 90D) from falling over. Inserting the spacer 101 between the bridge 93 and the bridge 94 ensures the insulation distance between the busbars 90A and 90B (the busbars 90C and 90D) constant. This further improves the insulation performance of the power conditioner device 10. The coupling 100 can secure the insulating plate member 104 and adjust the position of the busbars 90A and 90B (the busbars 90C and 90D) mutually.

In this embodiment, especially, the power conditioner device 10 includes the insulating plate member 104 disposed between the busbars 90A and 90B (the busbars 90C and 90D), which are coupled to one another with the coupling 100, and locked to the locking claw 102 of the coupling 100 with the busbar 90B (the busbar 90D). The insulating plate member 104 ensures the insulation distance between the busbars 90A and 90B (the busbars 90C and 90D), which are adjacent to one another. This further improves the insulation performance of the power conditioner device 10.

In this embodiment, especially, each of the plurality of legs 92 includes the opening 96 formed therein for restraining the heat conduction. The opening 96 formed in the leg 92 restrains the heat diffusion to the bridges 93 and 94 when the legs 92 of the busbars 90A to 90D are soldered on the printed board 80. This restrains the heat radiation from the busbars 90A to 90D in the soldering to make solder wicking proper.

In this embodiment, especially, the plate thickness of the busbars 90A to 90D is configured based on the skin depth corresponding to the frequency of the high frequency electric current flowing through the busbars 90A to 90D. This provides the following advantageous effects.

That is, when the high frequency electric current is flown through the busbars 90A to 90D, the skin effect causes the electric current to concentrate on the surface of the busbars 90A to 90D as the frequency increases. This increases the AC resistance of the busbars 90A to 90D. As a result, an increase in the loss and an excessive heat generation or the like possibly occur.

In this embodiment, the plate thickness of the busbars 90A to 90D is configured based on the skin depth corresponding to the frequency of the high frequency electric current. For example, the plate thickness of the busbars 90A to 90D is configured to be approximately double of the skin depth. This reduces the influence of the skin depth. Then, the loss and the heat generation in the busbars 90A to 90D can be restrained.

In this embodiment, especially, the power conditioner device 10 includes the temperature sensor 27 disposed on the busbar 90B to detect the temperature of the busbar 90B. This provides the following advantageous effects.

That is, for example, when the temperature sensor 27 is disposed on the position near the switching element 20 on the heat sink 60, the temperature sensor 27 detects the heat transmitted from the copper plate 25 for radiating the heat of the switching element 20 to the heat sink 60 via the insulating heat radiation sheet 23. On the other hand, as this embodiment, when the temperature sensor 27 is disposed on the busbar 90B, the temperature sensor 27 detects the heat transmitted to the busbar 90B via the wiring of the lead 21, which is integrated with the copper plate 25 of the switching element 20, and the printed board 80. In this case, the insulating material of the insulating heat radiation sheet 23 or the like is not interposed on the heat transfer route. Then, since the heat resistance of the heat transfer route decreases compared with the former case, the temperature followability of the temperature sensor 27 improves. Accordingly, the temperature of the switching element 20 can be detected with high accuracy.

<8. Modification>

The embodiment of the disclosure is not limited to the above description. Various modifications may be made to the embodiment of the disclosure within the scope of the gist and the technical idea of this disclosure.

Figure 18:
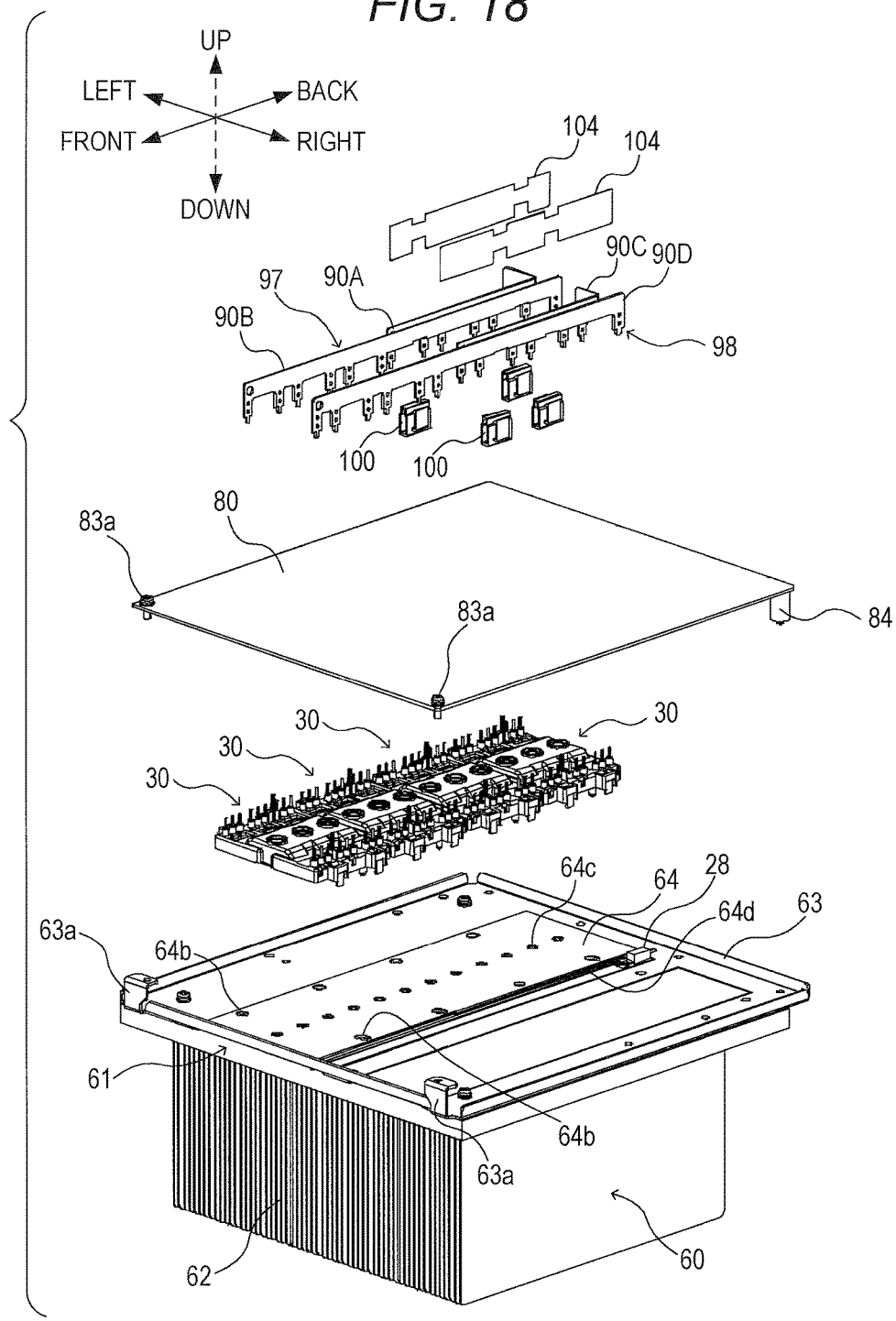
FIG. 18 is an exploded perspective view illustrating an exemplary internal constitution of a power conditioner device according to a modification where a temperature sensor is disposed on a heat sink.

In the above embodiment, the busbar includes the temperature sensor for detecting the heat of the switching element 20. However, the installation position of the temperature sensor is not limited to this. For example, as illustrated in FIG. 18, a temperature sensor 28 may be installed on proximity of the switching element 20 on the top surface of the base 61 of the heat sink 60. That is, the power conditioner device 10 may include the temperature sensor 28 disposed on the proximity of the switching element 20 in the heat sink 60 to detect the temperature of the switching element 20. In this case, the temperature sensor 28 is preferably disposed on the proximity of the switching element 20 that is to have the highest temperature among the plurality of switching elements 20. Even in the case, the temperature sensor 28 can detect the temperature of the switching element 20.

In the above description, a case where the power conversion apparatus is a power conditioner device is indicated as an example. However, the power conversion apparatus is not limited to the power conditioner device. The power conversion apparatus may be the other power conversion apparatus such as an inverter device, a converter device, or the like.

In the above description, the expressions such as "vertical," "parallel," "plane," and the like do not intend to be strictly interpreted. That is, the expressions such as "vertical," "parallel," and "plane" allow the tolerance and the error on the design and manufacturing, and respectively mean "substantially vertical," "substantially parallel," and "substantially plane."

In the above description, the expressions such as "identical," "equal," and "different" about the dimension and the size on appearance do not intend to be strictly interpreted. That is, the expressions such as "identical," "equal," and "different" allow the tolerance and the error on the design and manufacturing, and respectively mean "substantially identical," "substantially equal," and "substantially different."

Other than the above description, the above embodiment and a method in the modification may be combined for use as necessary.

Otherwise, while specific examples are omitted, various modifications may be made to the above embodiment and modifications to perform within the scope of the gist of the disclosure.

As illustrated in FIGS. 5 and 6, the casing 31 may house three sets of the switching elements 20 disposed parallel along the front-back direction (an exemplary second direction), which is along a surface direction of the printed board 80 and perpendicular to the right-left direction, with one set constituted of one pair of the switching elements 20 disposed mutually opposing in the right-left direction along the surface direction (an exemplary first direction). That is, in the three sets of the switching elements 20, the circuits 22 of the respective pairs of the switching elements 20 may be housed in the element housing portion 34 of the casing 31 per one set. As illustrated in FIG. 6, the switching element 20 housed in the casing 31 may expose the surface of the lower side of the circuit 22 to the lower side of the casing 31.

The embodiment of the disclosure may be the following first to eighteenth power conversion apparatuses.

The first power conversion apparatus includes a heat sink, a casing installed on the heat sink to house an electronic component where a heat is dissipated by the heat sink, a substrate that is disposed on an opposite side of the heat sink on the casing and includes a power converter circuit, a pressing member that is housed in the casing and presses the electronic component to the heat sink side, and an insulating cover member that is included in the casing and covers at least a part of the substrate side of the pressing member.

The second power conversion apparatus is the first power conversion apparatus where the cover member includes a cover main body and a contacting portion projecting from the cover main body to the substrate side to be brought in contact with the substrate.

The third power conversion apparatus is the second power conversion apparatus where the contacting portion includes a part contacting the substrate with at least one shape of liner and planar in a plan view viewed from the substrate side.

The fourth power conversion apparatus is the third power conversion apparatus where the electronic component is switching element, the substrate includes a wiring for a control signal that controls the switching element, and the cover member includes the cover main body on a position corresponding to the wiring.

The fifth power conversion apparatus is the fourth power conversion apparatus where the casing houses a plurality of sets of the switching elements disposed parallel along the second direction, which is along a surface direction of the substrate and perpendicular to a first direction, with one set constituted of one pair of the switching elements disposed mutually opposing in the first direction along the surface direction, the pressing member is disposed on a middle of the pair of the switching elements per the one set of the switching elements and presses the pair of the switching elements to the heat sink side, the substrate includes the wiring on a position corresponding to a middle of the pressing members adjacent to one another in the second direction, and the cover main body is disposed to extend at least on a position corresponding to the middle of the pressing members adjacent to one another in the second direction.

The sixth power conversion apparatus is any one of the first to the fifth power conversion apparatuses that further includes an insulating first plate member that is removably secured to the substrate and disposed between parts, projecting from the casing, of leads of the electronic component housed in the casing.

The seventh power conversion apparatus is any one of the first to the sixth power conversion apparatuses that further includes an insulating second plate member that is housed in the casing and disposed between a surface of the electronic component on an opposite side of the heat sink and the pressing member.

The eighth power conversion apparatus is any one of the first to the seventh power conversion apparatuses where the casing includes a guide that determine a position of the projecting position of the lead of the housed electronic component to the substrate side on a position of a through-hole formed on the substrate.

The ninth power conversion apparatus is the eighth power conversion apparatus where the casing includes two or more protrusions inserted into positioning holes formed on the substrate, and the protrusions are formed so as to have a projection height to the substrate side higher than the projection height of the lead.

The tenth power conversion apparatus is any one of the first to the ninth power conversion apparatuses where the electronic component includes a plurality of leads coupled to the substrate, and the casing includes an inlet configured to inject an insulating resin to at least a base end of the lead of the housed electronic component.

The eleventh power conversion apparatus is the tenth power conversion apparatus that further includes a resin cover that is installed on an opening on the heat sink side of the casing and covers at least the heat sink side of the base end of the lead.

The twelfth power conversion apparatus is any one of the first to the eleventh power conversion apparatus that further includes a conductive member that constitutes a part of the power converter circuit, and the conductive member includes a plurality of legs disposed upright on the substrate, and a bridge bridged across the plurality of legs.

The thirteenth power conversion apparatus is the twelfth power conversion apparatus that further includes an insulating coupling that couples a plurality of the conductive member, and the coupling includes a spacer inserted between the bridges of the conductive members adjacent to one another, and a plurality of locking claws coupled to the spacer and locked to the plurality of bridges one by one.

The fourteenth power conversion apparatus is the thirteenth power conversion apparatus that further includes an insulating third plate member disposed between the conductive members coupled to one another by the coupling and locked to the locking claw of the coupling along with the conductive member.

The fifteenth power conversion apparatus is any one of the twelfth to the fourteenth power conversion apparatuses where each of the plurality of legs includes an opening formed therein for restraining heat conduction.

The sixteenth power conversion apparatus is any one of the twelfth to the fifteenth power conversion apparatuses where a plate thickness of the conductive member is configured based on a skin depth corresponding to a frequency of a high frequency electric current flowing through the conductive member.

The seventeenth power conversion apparatus is any one of the twelfth to the sixteenth power conversion apparatuses that further includes a temperature sensor that is disposed on the conductive member and detects a temperature of the conductive member.

The eighteenth power conversion apparatus includes a heat sink, a casing installed on the heat sink to house an electronic component where a heat is dissipated by the heat sink, a substrate that is disposed on an opposite side of the heat sink on the casing and includes a power converter circuit, a pressing member that is housed in the casing and presses the electronic component to the heat sink side, and a means for insulating the pressing member from the substrate.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A power conversion apparatus comprising:
   a casing that houses an electronic component;
   a heat sink where the casing is installed, the heat sink dissipating heat from the electronic component;
   a substrate disposed on an opposite side of the heat sink in the casing, the substrate including a power converter circuit;
   a pressing member housed in the casing and mounted on the heat sink with a screw, the pressing member pressing the electronic component to a heat sink side; and
   an insulating cover member included in the casing between the pressing member and the substrate to cover at least a part of the pressing member such that the screw, a first opening of the insulating cover member, and a second opening of the substrate are arranged in an axial direction of the screw.

2. The power conversion apparatus according to claim 1, wherein
   the cover member includes a cover main body and a contacting portion that projects from the cover main body to a substrate side to be brought in contact with the substrate.

3. The power conversion apparatus according to claim 2, wherein
   a part of the contacting portion contacting the substrate has at least one shape of linear and planar in a plan view viewed from the substrate side.

4. The power conversion apparatus according to claim 3, wherein
   the electronic component is a switching element,
   the substrate includes a wiring for a control signal that controls the switching element, and
   the cover member includes the cover main body on a position corresponding to the wiring.

5. The power conversion apparatus according to claim 4, wherein
the casing houses a plurality of pairs of the switching elements disposed mutually opposing in a first direction along a surface direction of the substrate such that the plurality of pairs of the switching elements are disposed parallel along a second direction along the surface direction and perpendicular to the first direction,
the pressing member is disposed on a middle of the respective pairs of the switching elements and presses the pair of the switching elements to the heat sink side,
the substrate includes the wiring on a position corresponding to a middle of the pressing members adjacent to one another in the second direction, and
the cover main body is disposed to extend at least on a position corresponding to the middle of the pressing members adjacent to one another in the second direction.

6. The power conversion apparatus according to claim 1, further comprising
an insulating first plate member that is removably secured to the substrate and disposed between parts of leads of the electronic component, the parts projecting from the casing, the electronic component being housed in the casing.

7. The power conversion apparatus according to claim 1, further comprising
an insulating second plate member that is housed in the casing and disposed between a surface of the electronic component on an opposite side of the heat sink and the pressing member.

8. The power conversion apparatus according to claim 1, wherein
the casing includes a guide that determines a position of a projecting position of a lead of the housed electronic component to a substrate side on a position of a through-hole formed on the substrate.

9. The power conversion apparatus according to claim 8, wherein
the casing includes two or more protrusions inserted into positioning holes formed on the substrate, and
the protrusions are formed so as to have a projection height to the substrate side higher than the projection height of the lead.

10. A power conversion apparatus comprising:
a casing that houses an electronic component;
a heat sink where the casing is installed, the heat sink dissipating a heat from the electronic component;
a substrate disposed on an opposite side of the heat sink in the casing, the substrate including a power converter circuit;
a pressing member housed in the casing, the pressing member pressing the electronic component to a heat sink side; and
an insulating cover member included in the casing, the insulating cover covering at least a part of a substrate side of the pressing member, wherein
the electronic component includes a plurality of leads coupled to the substrate, and
the casing includes an inlet configured to inject an insulating resin to at least a base end of the lead of the housed electronic component.

11. The power conversion apparatus according to claim 10, further comprising
a resin cover that is installed in the casing between the base end of the lead and the heat sink to at least cover the base end of the lead.

12. The power conversion apparatus according to claim 1, further comprising
a conductive member that constitutes a part of the power converter circuit, wherein
the conductive member includes a plurality of legs disposed upright on the substrate and a bridge bridged across the plurality of legs.

13. The power conversion apparatus according to claim 12, further comprising:
an additional conductive member constituting a part of the power converter circuit and including an additional plurality of legs provided on the substrate and an additional bridge bridged across the additional plurality of legs; and
an insulating coupling that couples the conductive member and the additional conductive member, wherein
the coupling includes a spacer inserted between the bridge and the additional bridge adjacent to one another and a plurality of locking claws coupled to the spacer and locked to the bridge and the additional bridge.

14. The power conversion apparatus according to claim 13, further comprising
an insulating third plate member disposed between the conductive member and the additional conductive member.

15. The power conversion apparatus according to claim 12, wherein
each of the plurality of legs includes an opening formed therein for restraining heat conduction.

16. The power conversion apparatus according to claim 12, wherein
a plate thickness of the conductive member is configured based on a skin depth corresponding to a frequency of a high frequency electric current flowing through the conductive member.

17. The power conversion apparatus according to claim 12, further comprising
a temperature sensor that is disposed on the conductive member and detects a temperature of the conductive member.

18. The power conversion apparatus according to claim 1, further comprising
a temperature sensor that is disposed on proximity of the electronic component in the heat sink and detects a temperature of the electronic component.

19. A power conversion apparatus comprising:
a casing that houses an electronic component;
a heat sink where the casing is installed, the heat sink dissipating heat from the electronic component;
a substrate disposed on an opposite side of the heat sink in the casing, the substrate including a power converter circuit;
a pressing member housed in the casing and threadedly mounted on the heat sink with a screw, the pressing member pressing the electronic component to a heat sink side; and
means for insulating the pressing member from the substrate, the means for insulating having a first opening at a position corresponding to a position of a second opening of the substrate such that the screw, the first opening, and the second opening are arranged in an axial direction of the screw.

* * * * *